(12) United States Patent
Vimercati

(10) Patent No.: US 11,315,617 B2
(45) Date of Patent: **\*Apr. 26, 2022**

(54) ACCESS LINE MANAGEMENT FOR AN ARRAY OF MEMORY CELLS

(71) Applicant: Micron Technology, Inc., Boise, ID (US)

(72) Inventor: Daniele Vimercati, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/118,800

(22) Filed: Dec. 11, 2020

(65) Prior Publication Data

US 2021/0098045 A1  Apr. 1, 2021

Related U.S. Application Data

(63) Continuation of application No. 16/695,848, filed on Nov. 26, 2019, now Pat. No. 10,896,713, which is a
(Continued)

(51) Int. Cl.
*G11C 11/50* (2006.01)
*G11C 11/22* (2006.01)

(52) U.S. Cl.
CPC ........ *G11C 11/2259* (2013.01); *G11C 11/221* (2013.01); *G11C 11/2255* (2013.01);
(Continued)

(58) Field of Classification Search
CPC .............. G11C 11/2259; G11C 11/221; G11C 11/2255; G11C 11/2257
(Continued)

(56) References Cited

U.S. PATENT DOCUMENTS

| 4,491,936 A | 1/1985 | Eaton, Jr. et al. |
| 6,021,063 A | 2/2000 | Tai |

(Continued)

FOREIGN PATENT DOCUMENTS

| CN | 107665720 B | 6/2021 |
| JP | S6212997 A | 1/1987 |

(Continued)

OTHER PUBLICATIONS

IPO, "Office Action," issued in connection with ROC (Taiwan) Patent Application No. 108113009, dated Apr. 23, 2020 (6 pages).
(Continued)

*Primary Examiner* — Vu A Le
(74) *Attorney, Agent, or Firm* — Holland & Hart LLP

(57) ABSTRACT

Methods, systems, and devices for access line management for an array of memory cells are described. Some memory devices may include a plate that is coupled with memory cells associated with a plurality of digit lines and/or a plurality of word lines. Because the plate is coupled with a plurality of digit lines and/or word lines, unintended cross-coupling between various components of the memory device may be significant. To mitigate the impact of unintended cross-coupling between various components, the memory device may float unselected word lines during one or more portions of an access operation. Accordingly, a voltage of each unselected word line may relate to the voltage of the plate as changes in plate voltage may occur.

18 Claims, 18 Drawing Sheets

Related U.S. Application Data continuation-in-part of application No. 15/971,639, filed on May 4, 2018, now Pat. No. 10,529,401.

(52) U.S. Cl.
CPC ....... *G11C 11/2257* (2013.01); *G11C 11/2273* (2013.01); *G11C 11/2293* (2013.01)

(58) Field of Classification Search
USPC .......................................................... 365/145
See application file for complete search history.

(56) References Cited

U.S. PATENT DOCUMENTS

| | | | |
|---|---|---|---|
| 6,205,048 B1 | 3/2001 | Lee | |
| 6,845,031 B2 | 1/2005 | Kang et al. | |
| 7,257,013 B2 * | 8/2007 | Roehr | G11C 13/0011 365/148 |
| 9,583,183 B2 | 2/2017 | Fainzilber et al. | |
| 9,886,991 B1 | 2/2018 | Vimercati et al. | |
| 10,896,713 B2 * | 1/2021 | Vimercati | G11C 11/2259 |
| 2003/0142532 A1 | 7/2003 | Kang et al. | |
| 2005/0276089 A1 | 12/2005 | Madan et al. | |
| 2005/0281099 A1 | 12/2005 | Lovett | |
| 2007/0058417 A1 | 3/2007 | Roehr | |
| 2008/0025131 A1 * | 1/2008 | Scheuerlein | G11C 8/08 365/230.06 |
| 2008/0144351 A1 | 6/2008 | Eliason et al. | |
| 2009/0168490 A1 | 7/2009 | Madan | |
| 2011/0299355 A1 | 12/2011 | Rana | |
| 2013/0170313 A1 | 7/2013 | Earle et al. | |
| 2017/0278558 A1 | 9/2017 | Izumi et al. | |
| 2018/0040377 A1 | 2/2018 | Sakui | |

FOREIGN PATENT DOCUMENTS

| | | |
|---|---|---|
| JP | H1040687 A | 2/1998 |
| WO | 2018031474 A1 | 2/2018 |

OTHER PUBLICATIONS

ISA/KR, International Search Report and Written Opinion of the International Searching Authority, Int'l. Appl. No. PCT/US2019/025636, Jul. 18, 2019, Korean Intellectual Property Office, Seo-gu, Daejeon, Republic of Korea, 12 pgs.

China National Intellectual Property Administration, "First Office Action," issued in connection with Chinese Patent Application No. 201980029732.4, dated May 6, 2021 (5 pages).

Korean Intellectual Property Office, "Notice of Reasons for Rejection," issued in connection with Korean Patent Application No. 10-2020-7034736, dated Oct. 25, 2021 (4 pages).

European Patent Office, "Extended Search Report," issued in connection with European Patent Application No. 19795916.6, dated Dec. 17, 2021 (10 pages).

Japanese Patent Office, "Notice of Reasons for Refusal" issued in connection with Japanese Patent Application No. 2020-561629, dated Dec. 14, 2021 (8 pages).

\* cited by examiner

ACCESS LINE MANAGEMENT FOR AN ARRAY OF MEMORY CELLS

CROSS REFERENCES

The present application for patent is a continuation of U.S. patent application Ser. No. 16/695,848 by Vimercati, entitled "ACCESS LINE MANAGEMENT FOR AN ARRAY OF MEMORY CELLS," filed Nov. 26, 2019, which is a continuation-in-part of, claims the benefit of, and claims priority to U.S. patent application Ser. No. 15/971,639 by Vimercati, entitled "ACCESS LINE MANAGEMENT FOR AN ARRAY OF MEMORY CELLS," filed May 4, 2018, which is assigned to the assignee hereof and is expressly incorporated by reference in its entirety herein.

BACKGROUND

The following relates generally to managing access for memory cells and more specifically to access line management for an array of memory cells.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include increasing memory cell density, increasing read/write speeds, increasing reliability, increasing data retention, reducing power consumption, or reducing manufacturing costs, among other metrics.

DETAILED DESCRIPTION

Figure 1:
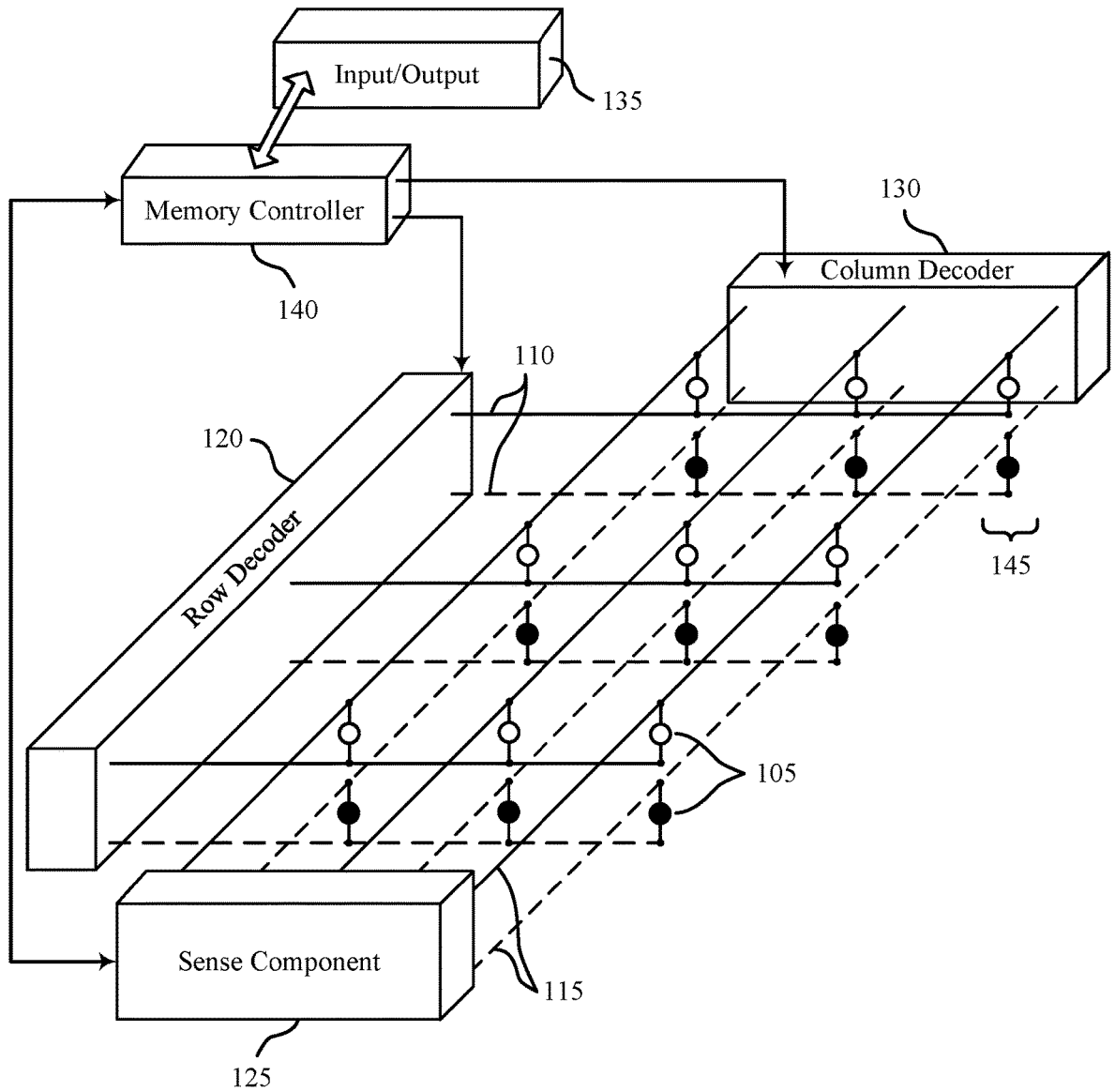
FIG. 1 illustrates an example of a memory array that supports access line management for an array of memory cells in accordance with examples of the present disclosure.

Some memory arrays may include a plate that is common to a plurality of memory cells, the memory cells also being associated with a plurality of digit lines and/or a plurality of word lines. As a voltage of the plate (and thus also that of an associated plate line) fluctuates in connection with an access operation for a selected memory cell (e.g., between a high voltage and a low voltage), some memory devices may maintain each word line for the unselected memory cells common to the plate (which may be referred to as unselected word lines) at a fixed voltage. This may result in leakage currents and associated power loss due to capacitive (e.g., parasitic) cross-coupling associated with each unselected word line (e.g., between each unselected word line and the common plate or plate line). Where a plate is common to many memory cells, the amount of capacitance (e.g., parasitic capacitance) and unintended cross-coupling between the plate and unselected word lines, and thus the amount of associated power loss, may be significant. Along with additional power consumption by the memory array, parasitic signals due to such unintended cross-coupling may disturb the logic states stored on unselected memory cells. For example, the parasitic signaling may result in errors being introduced into the data by changing the states stored on memory cells, or by introducing errors into access operations, among other effects.

Techniques are described herein for managing access lines (e.g., unselected access lines, unselected word lines) during an access operation in a memory device that may include a plate common to memory cells associated with a plurality of digit lines and/or a plurality of word lines (either directly or indirectly). For example, to reduce or mitigate the impact of unintended cross-coupling, the memory device may float multiple unselected access lines (e.g., word lines) when changing the voltage of a plate. Thus, the memory device may float the unselected word lines during one or more portions of an access operation for a selected memory cell, and in some cases for a duration prior to or subsequent to the access operation. Floating the unselected access lines may facilitate a voltage of each unselected access line tracking (e.g., maintaining a constant or near-constant differential with) the voltage of the plate and plate line, resulting in overall lower power consumption of the memory array, as well as fewer errors associated with the unselected memory cells. As used herein, floating a node may refer to electrically isolating the node from any defined voltage source.

Features of the disclosure introduced above are further described below in the context of FIGS. 1-3. Specific examples are then described with reference to FIGS. 4A-4B and 5A-5B as well as 11 and 12A-12D. These and other features of the disclosure are further illustrated by and described with reference to apparatus diagrams, system diagrams, and flowcharts that relate to techniques for access line management for an array of memory cells.

FIG. 1 illustrates an example memory array 100 in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states. A memory cell 105 may store a charge representative of the programmable states in a capacitor; for example, a charged and uncharged capacitor may represent two logic states, respectively. DRAM architectures may commonly use such a design, and the capacitor employed may include a dielectric material with linear or para-electric electric polarization properties as the insulator. By contrast, a ferroelectric memory cell may include a capacitor with a ferroelectric as the insulating material. Different levels of charge of a ferroelectric capacitor may represent different logic states. Ferroelectric materials have non-linear polarization properties; some details and advantages of a ferroelectric memory cell 105 are discussed below.

Memory array 100 may be a three-dimensional (3D) memory array, where two-dimensional (2D) memory arrays are formed on top of one another. This may increase the number of memory cells that may formed on a single die or substrate as compared with 2D arrays, which in turn may reduce production costs or increase the performance of the memory array, or both. According to the example depicted in FIG. 1, memory array 100 includes two levels of memory cells 105 and may thus be considered a three-dimensional memory array; however, the number of levels is not limited to two. Each level may be aligned or positioned so that memory cells 105 may be approximately aligned with one another across each level, forming a memory cell stack 145. In some cases, the memory array 100 may be referred to as a memory device 100.

Each row of memory cells 105 is connected to an access line 110, and each column of memory cells 105 is connected to a bit line 115. Access lines 110 and bit lines 115 may be substantially perpendicular to one another to create an array. In addition, each row of memory cells 105 may be coupled to at least one plate line (not shown). As used herein, the terms plate node, plate line, or simply plate may be used interchangeably. As shown in FIG. 1, each memory cell 105 in a memory cell stack 145 may be coupled to separate conductive lines such as bit lines 115. In other examples (not shown), two memory cells 105 in a memory cell stack 145 may share a common conductive line such as a bit line 115. That is, a bit line 115 may be in electronic communication with the bottom electrode of the upper memory cell 105 and the top electrode of the lower memory cell 105. Other configurations may be possible, for example, a third deck may share an access line 110 with a lower deck. In general, one memory cell 105 may be located at the intersection of two conductive lines such as an access line 110 and a bit line 115. This intersection may be referred to as a memory cell's address. A target memory cell 105 may be a memory cell 105 located at the intersection of an energized access line 110 and bit line 115; that is, access line 110 and bit line 115 may be energized in order to read or write a memory cell 105 at their intersection. Other memory cells 105 that are in electronic communication with (e.g., connected to) the same access line 110 or bit line 115 may be referred to as untargeted memory cells 105.

As discussed above, electrodes may be coupled to a memory cell 105 and an access line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory array 100.

Operations such as reading and writing may be performed on memory cells 105 by activating or selecting access lines 110 and digit lines 115. Access lines 110 may also be known as word lines 110, and bit lines 115 may also be known digit lines 115. Generally, the term access line may refer to word lines, bit lines, digit lines, or plate lines. References to word lines and bit lines, or their analogues, are interchangeable without loss of understanding or operation. Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), etc.), metal alloys, carbon, conductively-doped semiconductors, or other conductive materials, alloys, compounds, or the like.

In some architectures, the logic storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105. Upon selecting a memory cell 105, the resulting signal may be used to determine the stored logic state.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. For example, memory array 100 may include multiple word lines 110, and multiple digit lines 115. Thus, by activating a word line 110 and a digit line 115, the memory cell 105 at their intersection may be accessed. As is described in more detail below, by floating an unselected access line (e.g., an unselected word line), the effects of unintended cross-coupling may be mitigated. For example, the plate may be coupled with a plurality of memory cells, which may in turn be coupled (directly or indirectly) with a plurality of word lines and a plurality of digit lines. During a period associated with an access operation of one memory cell, the word lines associated with the remaining unselected memory cells coupled with the plate may be floated. By floating the unselected word lines, the effects associated with cross-coupling between the unselected word lines and the plate may be mitigated.

Upon accessing, a memory cell 105 may be read, or sensed, by sense component 125 to determine the stored state of the memory cell 105. For example, after accessing the memory cell 105, the capacitor of memory cell 105 may discharge onto its corresponding digit line 115. Discharging the capacitor may result from biasing, or applying a voltage, to the capacitor. The discharging may cause a change in the voltage of the digit line 115, which sense component 125 may compare to a reference voltage (not shown) in order to determine the stored state of the memory cell 105. Exemplary access operations are described below with reference to FIGS. 4A through 4B, and 5A through 5B.

Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. As described in more detail below, unselected word lines may be floated during a period associated with an access operation to mitigate effects associated with cross-coupling of the word lines.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written. But in non-volatile memory, such as an array that employs ferroelectrics, accessing the memory cell 105 may not destroy the logic state and, thus, the memory cell 105 may not require re-writing after accessing. In some examples, multiple levels of memory cells may be coupled to the same plate. Such a plate configuration may result in a smaller amount of area used to connect higher levels memory cells to the substrate.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery.

The memory controller 140 may control the operation (e.g., read, write, re-write, refresh, discharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory array 100. For example, it may apply discharge voltages to a word line 110 or digit line 115 after accessing one or more memory cells 105. In general, the amplitude, shape, or duration of an applied voltage or current discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

In some examples, memory controller 140 may be configured to float one or more access lines (e.g., word lines 110) of memory array 100 during one or more periods associated with an access operation. For example, memory controller 140 may identify an access operation associated with a selected memory cell 104. Upon identifying the access operation, memory controller 140 may initiate driving a plate (not shown) from a first voltage to a second voltage based at least in part on the access operation associated with the selected memory cell 105. In some examples, the memory controller 140 may initiate floating an access line (e.g., a word line 110) for an unselected memory cell 105 based at least in part on the access operation associated with the selected memory cell 105. The memory controller 140 may be configured to initiate floating the unselected access line simultaneously with or before initiating driving the plate to the second voltage. Accordingly, during an access operation, memory controller 140 may select one access line while other access lines of memory array 100 (e.g., other access lines associated with unselected memory cells 105 that share a plate with the selected memory cell 105) are floated. By floating the unselected access lines, undesired effects associated with cross-coupling between the unselected access lines and other aspects memory array 100 (e.g., a plate common to a selected memory cell 105 and one or more unselected memory cells 105) may be avoided or mitigated.

Figure 2:
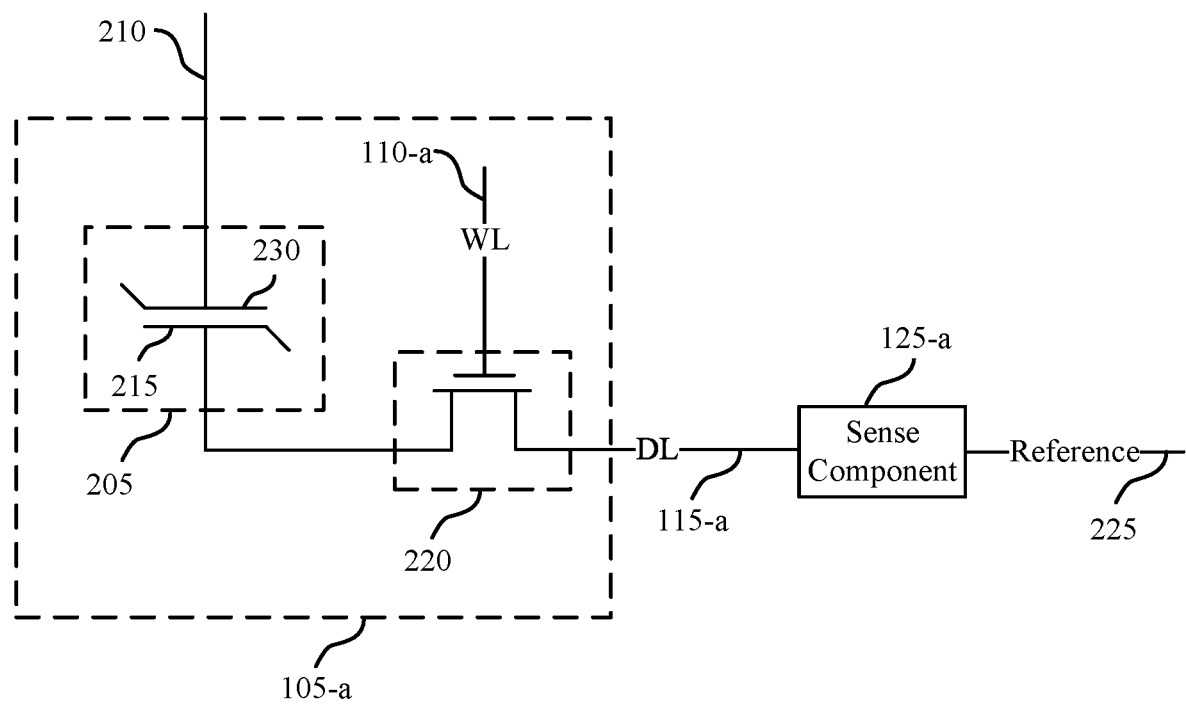
FIG. 2 illustrates an example of a circuit that supports techniques for access line management in accordance with examples of the present disclosure.

FIG. 2 illustrates an example circuit 200 in accordance with various embodiments of the present disclosure. Circuit 200 includes a memory cell 105-*a*, word line 110-*a*, digit line 115-*a*, and sense component 125-*a*, which may be examples of a memory cell 105, word line 110, digit line 115, and sense component 125, respectively, as described with reference to FIG. 1. Memory cell 105-*a* may include a logic storage component, such as capacitor 205 that has a first plate, cell plate 230, and a second plate, cell bottom 215. Cell plate 230 and cell bottom 215 may be capacitively coupled through a material (e.g., a ferroelectric material) positioned between them. The orientation of cell plate 230 and cell bottom 215 may be flipped without changing the operation of memory cell 105-*a*. Circuit 200 also includes selection component 220 and reference line 225.

Cell plate 230 may be accessed via plate line 210 and cell bottom 215 may be accessed via digit line 115-*a*. In some cases, some memory cells 105-*a* may share access lines (e.g., digit lines, word lines, plate lines) with other memory cells. For example, a digit line 115-*a* may be shared with memory cells 105-*a* in a same column, a word line 110-*a* may be shared with memory cells 105-*a* in the same row, and a plate line 210 (and a corresponding plate 230) may be shared with memory cells 105-*a* in the same section, tile, deck, or even multiple decks. As described above, various states may be stored by charging or discharging the capacitor 205. In many examples, a connector or socket may be used to couple digit lines 115-*a* or plate lines 210 of upper level levels of memory cells to a substrate positioned below the arrays of memory cells. The size of the connector or socket may be modified based on the configuration of the plate lines in the memory array.

In some cases, a memory array 100 that includes a plate (not shown) that is coupled with multiple memory cells 105 associated with a plurality of different word lines 110 and/or digit lines 115 may have unique access operations as described herein. For example, unselected word lines, if maintained at a fixed voltage while a plate voltage changes, may result in unwanted leakage or power consumption due to capacitance between the unselected word lines and the plate, or between the unselected word lines and one or more digit lines. Consequently, techniques are provided herein for mitigating or reducing the impact of such capacitance or cross-coupling during an access operation of a memory array that includes a plate common to more than one memory cell 105, which may be referred to as a common plate.

The stored state of capacitor 205 may be read or sensed by operating various elements represented in circuit 200. Capacitor 205 may be in electronic communication with digit line 115-*a*. For example, capacitor 205 can be isolated from digit line 115-*a* when selection component 220 is deactivated, and capacitor 205 can be connected to digit line 115-*a* when selection component 220 is activated. Activating selection component 220 may be referred to as selecting memory cell 105-*a*. In some cases, selection component 220 is a transistor and its operation is controlled by applying a voltage to the transistor gate, where the voltage magnitude is greater than the threshold magnitude of the transistor. Word line 110-*a* may activate the selection component 220; for example, a voltage applied to word line 110-*a* is applied to the transistor gate, connecting capacitor 205 with digit line 115-*a*. As is described in more detail below, the access operations (e.g., read operation or write operation) may be conducted based on the plate configuration of the memory array. For example, one or more unselected access lines (e.g., unselected word lines; not shown) may be floated. By floating the unselected access lines, negative cross-coupling effects may be prevented or mitigated.

In other examples, the positions of selection component 220 and capacitor 205 may be switched, such that selection component 220 is connected between plate line 210 and cell plate 230 and such that capacitor 205 is between digit line 115-*a* and the other terminal of selection component 220. In this embodiment, selection component 220 may remain in electronic communication with digit line 115-*a* through capacitor 205. This configuration may be associated with alternative timing and biasing for read and write operations.

In some cases, due to a ferroelectric material between the plates of capacitor 205, capacitor 205 may not discharge upon connection to digit line 115-*a*. In one scheme, to sense the logic state stored by a ferroelectric capacitor 205, word line 110-*a* may be biased to select memory cell 105-*a* and a voltage may be applied to plate line 210. In some cases, digit line 115-*a* is virtually grounded and then isolated from the virtual ground, prior to biasing the plate line 210 and word line 110-*a*. Biasing the plate line 210 may result in a voltage difference (e.g., plate line 210 voltage minus digit line 115-*a* voltage) across capacitor 205. The voltage difference may yield a change in the stored charge on capacitor 205, where the magnitude of the change in stored charge may depend on the initial state of capacitor 205—e.g., whether the initial state stored a logic 1 or a logic 0. This may cause a change in the voltage of digit line 115-*a* based on the charge stored on capacitor 205. Operation of memory cell 105-*a* by varying the voltage to cell plate 230 may be referred to as "moving cell plate." As is described in more detail below, some aspects of the access operations (e.g., read operation or write operation) may be modified based on the plate configuration of the memory array.

The change in voltage of digit line 115-*a* may depend on its intrinsic capacitance. That is, as charge flows through digit line 115-*a*, some finite charge may be stored in digit line 115-*a* and the resulting voltage depends on the intrinsic capacitance. The intrinsic capacitance may depend on physical characteristics, including the dimensions, of digit line 115-*a*. Digit line 115-*a* may connect many memory cells 105 so digit line 115-*a* may have a length that results in a non-negligible capacitance (e.g., on the order of picofarads (pF)). The resulting voltage of digit line 115-*a* may then be compared to a reference (e.g., a voltage of reference line 225) by sense component 125-*a* in order to determine the stored logic state in memory cell 105-*a*. Other sensing processes may be used.

Sense component 125-*a* may include various transistors or amplifiers to detect and amplify a difference in signals, which may be referred to as latching. Sense component 125-*a* may include a sense amplifier that receives and compares the voltage of digit line 115-*a* and reference line 225, which may be a reference voltage. The sense amplifier output may be driven to the higher (e.g., a positive) or lower (e.g., negative or ground) supply voltage based on the comparison. For instance, if digit line 115-*a* has a higher voltage than reference line 225, then the sense amplifier output may be driven to a positive supply voltage.

In some cases, the sense amplifier may additionally drive digit line 115-*a* to the supply voltage. Sense component 125-*a* may then latch the output of the sense amplifier and/or the voltage of digit line 115-*a*, which may be used to determine the stored state in memory cell 105-*a*, e.g., logic 1. Alternatively, if digit line 115-*a* has a lower voltage than reference line 225, the sense amplifier output may be driven to a negative or ground voltage. Sense component 125-*a* may similarly latch the sense amplifier output to determine the stored state in memory cell 105-*a*, e.g., logic 0. The latched logic state of memory cell 105-*a* may then be output, for example, through column decoder 130 as output 135 with reference to FIG. 1.

To write memory cell 105-*a*, a voltage may be applied across capacitor 205. Various methods may be used. In one example, selection component 220 may be activated through word line 110-*a* in order to electrically connect capacitor 205 to digit line 115-*a*. A voltage may be applied across capacitor 205 by controlling the voltage of cell plate 230 (through plate line 210) and cell bottom 215 (through digit line 115-*a*). To write a logic 0, cell plate 230 may be taken high, that is, a positive voltage may be applied to plate line 210, and cell bottom 215 may be taken low, e.g., virtually grounding or applying a negative voltage to digit line 115-*a*. The opposite process is performed to write a logic 1, where cell plate 230 is taken low and cell bottom 215 is taken high.

Figure 3:
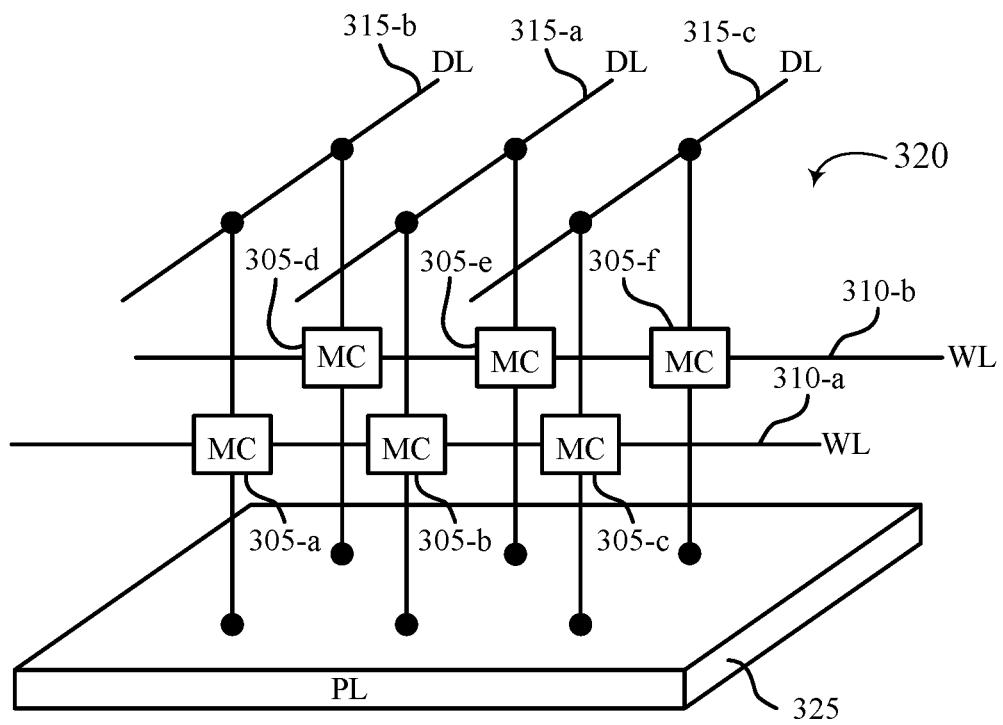
FIG. 3 illustrates an example of a memory device that supports techniques for access line management in accordance with examples of the present disclosure.

FIG. 3 illustrates an example of a memory device 300 that supports techniques for access line management for an array of memory cells in accordance with examples of the present disclosure. The memory device 300 may include a plurality memory cells 305 coupled with one or more word lines 310 and one or more digit lines 315 to form an array 320. The memory device 300 may include a plate 325 that is coupled with one or more memory cells 305 associated with multiple word lines 310 or multiple digit lines 315 in the array 320. In some examples, the memory array 320 may include a plurality of ferroelectric memory cells or other capacitor-based memory cells.

For example, the plate 325 may be coupled with memory cells 305 that are associated with a first word lines 310-*a* and a second word line 310-*b* and/or memory cells 305 that are associated with a first digit line 315-*a*, a second digit line 315-*b*, and a third digit line 315-*c*. In some cases, a single plate 325 may be coupled with memory cells 305 associated with (e.g., coupled with) any number of word lines 310 or digit lines. The memory device 300 may be an example of or included in the memory array 100 described with reference to FIG. 1.

In some examples, a quantity of plate nodes in an array of memory cells may be reduced relative to alternative architectures by having one or more plates that are each common to multiple memory cells. This may result in more efficient use of die area in the memory array and/or more efficient use of power during access operations. In some cases, a plate driver associated with the plate 325 may be positioned outside of the memory array 320, thereby providing more space to other components of the array 320. In addition, by reducing the number of plates, the memory device 300 may be configured to reduce a number of plate drivers in an array of memory cells relative to alternative architectures.

In some cases, a single plate 325 may be coupled with memory cells 305 of different decks. In some such cases, the single plate 325 may be coupled with memory cells of a first deck and memory cells of a second deck. Such arrangements may result in even more reductions in plates and plate drivers in the array 320.

Having a plate 325 common to multiple memory cells may create an associated risk of undesirable coupling between different components of the array 320. During an access operation of a selected memory cell, unselected access lines (e.g., unselected word lines) may be susceptible to cross-coupling with one or more digit lines 315 and the plate 325 during the access operation. In some cases, the cross-coupling may result in parasitic signals (e.g., leakage currents) between each unselected word line 310 and a respective digit line 315, and between each unselected word line 310 and the plate 325. Because such parasitic effects may occur at every unselected word line 310, in a memory array containing multiple word lines and multiple digit lines, the impact of such effects may be significant. In some examples, such cross-coupling and related effects may "disturb" the logic states stored on unselected memory cells. For example, the parasitic signals may cause a charge to be stored on a middle electrode of an unselected memory cell 305. In some cases, such accumulation or other parasitic effects may result in additional power consumption by the memory device 300.

During an access operation, usually only a small number of memory cells (e.g., one or more) are accessed in a given segment of the array 320. In the illustrative example of FIG. 3, memory cell 305-*b* may be the selected memory cell for an access operation (e.g., read, write, and/or precharge) and memory cells 305-*a*, 305-*c*, 305-*d*, 305-*e*, and 305-*f* may be unselected memory cells. Each of these memory cells 305 are coupled with a common plate 325. In such an example, parasitic signals (e.g., due to unintended capacitive cross-coupling) may develop between the unselected word line 310-*b* and the unselected digit lines (e.g., 315-*b*, 315-*c*), and between each of the unselected word lines and the plate 325.

In some cases, when the plate 325 is biased from a first state to a second state (e.g., driven from a first voltage to a second voltage), parasitic signals may occur between a number of components. For example, biasing the plate 325 to a first voltage while maintaining the unselected word lines 315-*b*, 315-*c* at a fixed voltage may cause parasitic signals due to capacitance between each unselected word line and a respective digit line, and between each unselected word line and the plate 325. To avoid or mitigate such undesired effects, the unselected word lines 315-*b*, 315-*c* may be floated with respect to the plate 325. For example, if the plate 325 is biased from a first voltage to a second voltage as part of an access operation for the selected memory cell 305-*b*, the unselected digit lines 315-*b*, 315-*c* may be floated as the voltage of the plate 325 changes and, in turn, may track (e.g., maintain a common differential with) the voltage of the plate 325.

Such operations may be carried out on any combination of unselected word lines. For example, a memory array may include a plurality of word lines (e.g., 1024 word lines) and a plurality of digit lines (e.g., 1024 digit lines). During a single access operation a large quantity of word lines may be unselected (e.g., 1023 unselected word lines). Floating any combination of unselected word lines (e.g., any of 1023 unselected word lines) during a period associated with an access operation associated with a selected word line may result in improved performance for the entire memory device 300 (e.g., reduced power consumption, increased reliability).

The memory cells 305 may be examples of the memory cells 105 described with reference to FIG. 1. In some cases, the memory cells 305 may be ferroelectric memory cells, DRAM memory cells, NAND memory cells, phase-change memory cells, or any other type of memory cells. The word lines 310 may be examples of word lines 110 described with reference to FIG. 1. The digit lines 315 may be examples of the digit lines 115 described with reference to FIG. 1. The plate 325 may be an example of and may be related to the plate 230 and/or the plate line 210 described with reference to FIG. 2.

By way of example, FIG. 3 may illustrate a memory array 320 that includes a first memory cell 305-*a* and a second memory cell 305-*f*. As described above, the memory array 320 may include a plate 325 coupled with the first memory cell 305-*a* and the second memory cell 305-*f*, and may include a plate line driver (not shown) coupled with the plate 325. In some examples, a first access line 310-*a* may be coupled with the first memory cell 305-*a*, and an access line driver (not shown) may be coupled with the first access line 310-*a*. In some examples, the access line driver may be configured to float the first access 310-*a* line for a duration based at least in part on an access operation associated with the second memory cell 305-*f*. In some examples, each of memory cells 305-*a*, 305-*b*, 305-*c*, 305-*d*, and 305-*e* may be floated for the duration based at least in part on the access operation associated with memory cell 305-*f*. In some examples, the plate line driver may be configured to drive the plate 325 to a first voltage before the duration, and may be configured drive the plate 325 to a second voltage during the duration based at least in part on the access operation associated with the second memory cell 305-*f*.

Figure 4A:
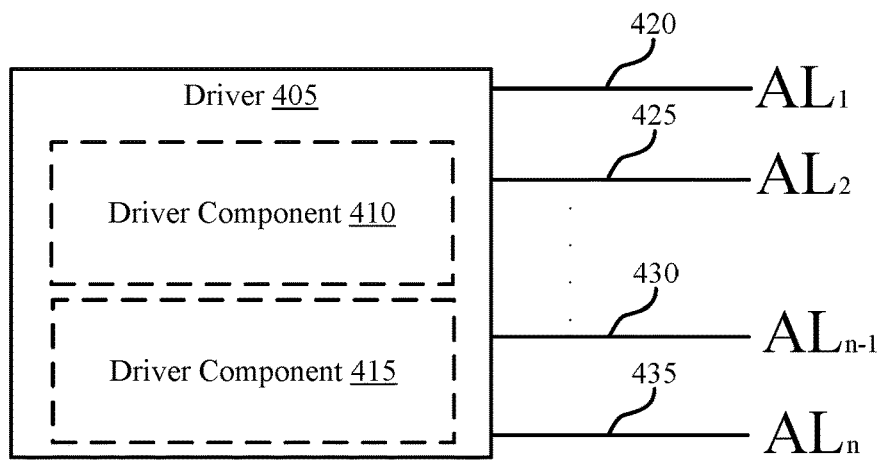
FIGS. 4A and 4B illustrate an example of a memory device and timing diagram that support techniques for access line management in accordance with examples of the present disclosure.

FIG. 4A illustrates examples of a memory device 400-*a* that supports techniques for access line management for an array of memory cells in accordance with examples of the present disclosure. In some examples, memory device 400-*a* may include driver 405, which may be referred to as memory driver 405. Memory driver 405 may be coupled with any number of access lines, and may facilitate an access operation of one or more memory cells (e.g., memory cells 305-*a* through 305-*f* as described with reference to FIG. 3). Memory driver 405 may be coupled with, for example, access line 420, access line 425, access line 430, and access line 435. Each of access lines 420, 425, 430, and 435 may be examples of a word line (e.g., word lines 310-*a*, 310-*b* as described with reference to FIG. 3) of a memory array. Memory driver 405 may include various sub-components, such as driver component 410 and driver component 415. In other examples (not shown), memory driver 405 may contain any number of sub-components (e.g., any number of driver components).

As described above, each of access lines 420, 425, 430, and 435 may be examples of a word line of a memory array (e.g., memory array 320 as described with reference to FIG. 3). For example, access line 420 may be referred to as a first access line 420 and access line 425 may be referred to as a second access line 425. Additionally or alternatively, access line 430 and access line 435 may examples of access lines that represent a total number of access lines associated with memory device 400-*a*.

For example, access line 435 may be referred to as access line "$AL_n$" where "n" is a total number of access lines associated with the memory array, and access line 430 may be referred to as access line "$AL_{n-1}$." In some examples a memory array associated with driver 405 may include 1024 access lines (e.g., word lines), thus access line 430 may represent the 1023rd access line of the memory array, and access line 435 may represent the 1024th access line of the memory array. Each of access lines 420, 425, 430, and 435 may be associated with a respective individual memory cell—e.g., no memory cell 105 may be common across access lines 420, 425, 430, and 435, regardless of whether any of access lines 420, 425, 430, and 435 is associated with a single memory cell 105 or multiple memory cells 105.

In some examples, memory driver 405 may facilitate an access operation of a memory cell coupled with one of access lines 420, 425, 430, or 435. For example, an access operation may be conducted on a memory cell coupled with access line 425, which may be referred to as a second memory cell. A memory controller (e.g., memory controller 140 as described with reference to FIG. 1) may identify an access operation associated with the second memory cell. Driver 405 may then float (e.g., for a duration) first access line 420. In some examples, driver 405 may float each of access lines 420 through 435 other than access line 425. Stated another way, driver 405 may float every unselected access line associated with memory cells 105 having a common plate with the selected memory cell. Floating the unselected access lines may cause a voltage of each unselected access line to track a voltage of the relevant plate (e.g., plate 325 as described with reference to FIG. 3).

In the examples described above, memory driver 405 may include any number of sub-components, and each sub-component may be coupled with any number of access lines. For example memory driver 405 may include a separate driver component for each access line, may include separate driver components for each unique subset of access lines.

Figure 4B:
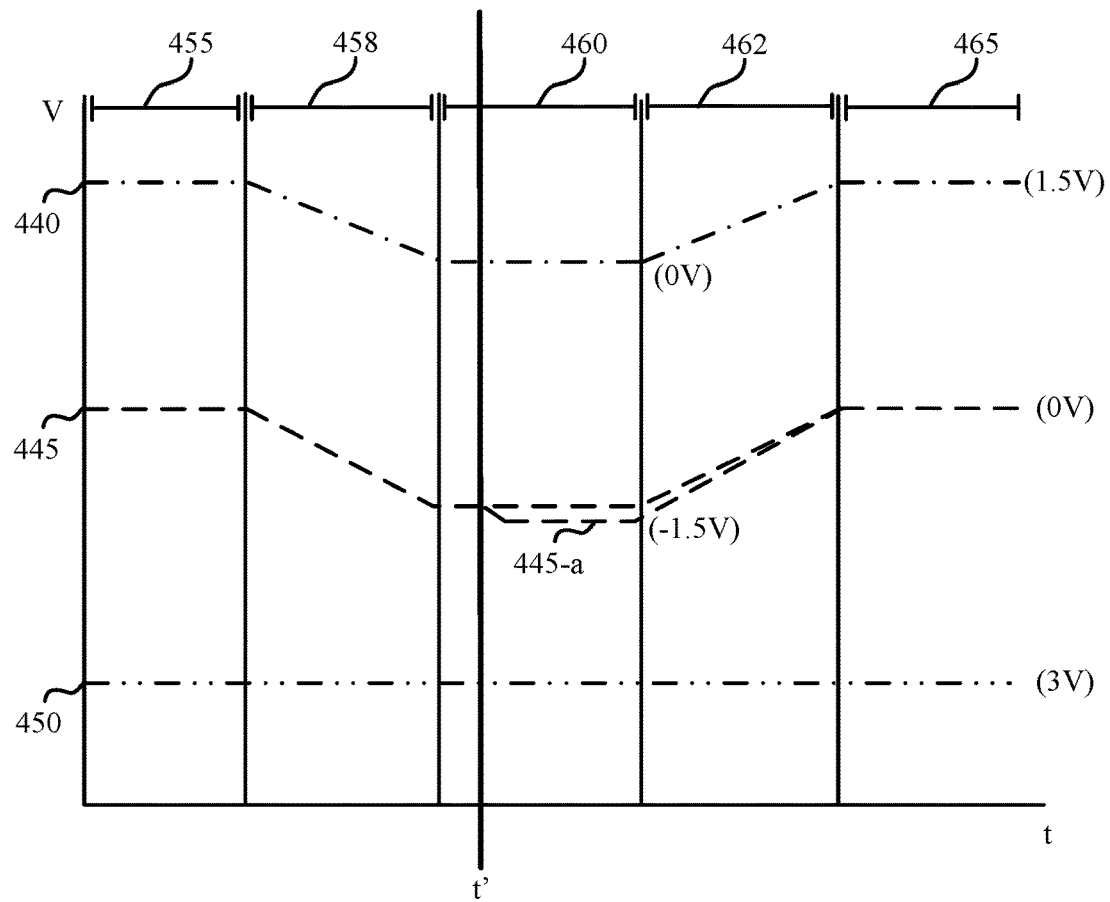

FIG. 4B illustrates an example timing diagram 400-*b* that supports techniques for access line management for an array of memory cells in accordance with examples of the present disclosure. In some examples, timing diagram 400-*b* may illustrate an access operation associated with memory device 400-*a* as described above with reference to FIG. 4A. In some examples, timing diagram 400-*b* may illustrate voltages of a plate line 440, unselected access lines 445, 445-*a*, and a selected access line 450 as described above with reference to FIG. 4A. Timing diagram 400-*b* may illustrate the voltages of plate line 440, unselected access line 445, 445-*a*, and selected access line 450 during intervals 455, 458, 460, 462 and 465.

As described above, a memory array may include a plurality of respective access lines (e.g., access lines 420, 425, 430, and 435 as described above with reference to FIG. 4A) for a plurality of memory cells, each memory cell having a common plate. Each access line may be referred to as a word line and may be selected or unselected (e.g., by a driver) based on a particular access operation. Any one access line may be selected during a particular access operation, and a remaining number of access lines associated with the plate may remain unselected during the operation. For example, memory cells to which the plate is common may be associated with 1024 access lines (e.g., word lines). Thus, during an access operation, one access line associated with the memory cell to be accessed may be selected (e.g., selected access line 450), and a remaining number of access lines may remain unselected (e.g., unselected access lines 445, 445-*a*). As described above with reference to FIG. 3, a plate (e.g., plate line 440) may be coupled with the memory array.

An access operation associated with a memory cell may be identified (e.g., by a memory controller 140 as described with reference to FIG. 1). At interval 455, the plate line 440 is shown as initially driven to a first voltage (e.g., a high voltage, such as 1.5V). The selected access line 450 is shown as driven to a high voltage (e.g., 3V), and the unselected access lines 445 are shown as driven to a different voltage (e.g., 0V). The unselected access lines 445 may be referred to as being at a different voltage (e.g., 0V) as the unselected lines may transition between the voltage (e.g., 0V) and a negative voltage during the intervals depicted in FIG. 4B.

At interval 458, the plate line 440 may transition from the first voltage (e.g., the high voltage) to a second voltage (e.g., a low voltage, such as 0V). The selected access line 450 may remain at a high value (e.g., 3V), and the unselected access lines 445 may be floated. In some examples, the unselected access lines 445 may be floated simultaneously with the plate line 440 transitioning to a second voltage, or the unselected access lines 445 may begin being floated some guard period before the plate line 440 transitions to a second voltage to ensure the unselected access lines 445 are floating as the voltage of the plate line 440 begins to transition.

Due to capacitive coupling between the unselected access lines 445 and the plate line 440, floating the unselected access lines 445 may result in a voltage of the unselected access lines 445 tracking a voltage of the plate line 440. Stated another way, as the voltage of the plate line 440 decreases during interval 458, it may pull down the voltage of the floating unselected access lines 445 by an equal or substantially similar amount. For example, if the voltage of the plate line 440 decreases from 1.5V to 0V, the voltage of the unselected access lines 445 may decrease from 0V to or approximately to −1.5V. By allowing the voltage of the unselected access lines 445 to track the voltage of the plate line 440 as the voltage of the plate line 440 changes, a voltage differential between the plate line 440 and the unselected access lines 445 may remain constant or substantially constant. Thus, as the voltage of the plate line 440 changes, a leakage current (e.g., due to capacitive coupling between the plate line 440 and the unselected access lines 445) may be reduced or eliminated, and power consumption associated with the access operation may be reduced.

At interval 460, the plate line 440 may remain at a second voltage (e.g., a low voltage, such as 0V), and the selected access line 450 may remain at a high voltage (e.g., 3V). In some examples, the unselected access lines 445 may continue to float throughout interval 460, and the voltage of the unselected access lines 445 may thus stay at the level obtained at the end of interval 458. In such examples, the difference between the voltage of the unselected access lines 445 and the voltage of the plate line 440 during interval 460 may not be precisely what it was during interval 455. For example, if the voltage of the plate line 440 decreases from 1.5V to 0V, the voltage of the unselected access lines 445 may decrease during interval 458 from 0V to some level near but not precisely equal to −1.5V (e.g., −1.4V), and the voltage of the unselected access lines 445 may remain at that approximate level (e.g., −1.4V) throughout interval 460.

In some examples, after being floated, the unselected access lines 445 may be driven to a desired low voltage based on and compatible with voltage change of the plate line 440 during interval 458, as shown in FIG. 4B by the unselected access line 445-a. The unselected access lines 445-a may be driven to a desired voltage based on the plate voltage swing, for example, such that a subsequent voltage differential between the plate line 440 and the unselected access lines 445-a is ensured to be the same as during interval 455 (e.g., if the voltage of the plate changes from 1.5V to 0V during interval 458, and the voltage of the unselected access lines 445 was 0V during interval 455, the voltage of the unselected access lines 445 may be driven to −1.5V, to ensure a voltage differential of 1.5V).

In some examples, the unselected access lines 445-a may be driven to a desired voltage at the beginning of interval 460 (e.g., once the plate line 440 reaches the second voltage) or at some later time during interval 460 (e.g., at time t'). In other examples, the unselected access lines 445-a may be driven to a desired voltage at the onset of interval 460. Driving the unselected access lines 445 to a desired voltage such to ensure a desired voltage differential relative to the voltage of the plate line 440 (e.g., a voltage differential equal to that during interval 455) may introduce some amount of additional complexity as opposed to continuing to float the unselected access lines 445 throughout interval 460 but may further reduce leakage currents and associated power consumption as a result of change the voltage of the plate line 440 and may provide greater control over the voltage of the unselected access lines 445 during interval 460. Thus, the voltage of the unselected access lines 445 may track the voltage of the plate line 440.

At interval 462, the plate line 440 may be driven from the second voltage (e.g., from a low voltage) to the first voltage (e.g., to a high voltage). The selected access line 450 may remain at a high voltage (e.g., at 3V) and the unselected access lines 445 may be floated (either remain floating in the case it was floated throughout interval 460, or in the case of unselected access line 445-a, begin floating at or some guard period prior to the time the plate line 440 voltage begins transitioning). Because of capacitive coupling between the unselected access lines 445 and the plate line 440, floating the unselected access lines 445 may result in a voltage of the unselected access lines 445 tracking (e.g., tracking substantially) a voltage of the plate line 440. Accordingly, a voltage of the unselected access lines 445 may increase as a voltage of the plate line 440 increases. By tracking a voltage of the plate line 440, a voltage differential between a voltage of the plate line 440 and a voltage of the unselected access lines 445 may remain constant or substantially constant. Thus a leakage current associated with the plate line 440 and the unselected access lines 445 may be mitigated, and power consumption of the associated memory device may be reduced.

At interval 465, the selected access line 450 may remain at a high voltage (e.g., 3V). The plate line 440 may return to a first voltage (e.g., a high voltage) as described at interval 455, and the unselected access lines 445 may be driven to a high voltage (e.g., 0V). As described above, the unselected access lines 445 may be referred to as being at a high voltage (e.g., 0V) due to transitioning between a high voltage (e.g., 0V) and a negative voltage.

Though shown in the example of FIG. 4B as transitioning from a high voltage to a low voltage and back to the high voltage, in some examples, the techniques described herein may apply when the plate line 440 transitions from a low voltage to a high voltage and back to a low voltage. When the plate line 440 transitions from a low voltage to a high voltage or from a high voltage to a low voltage, this may be referred to as toggling or toggling a voltage of the plate line 440. Regardless of the direction of the toggling, the unselected access lines 445, 445-a may be floated when a voltage of the plate line 440 is toggled.

In various examples, plate toggling may occur and thus unselected access lines 445, 445-a may be floated at any time associated with an access operation. For example, the unselected access lines 445, 445-a may be floated before, during, or after the selected memory cell is accessed (e.g., read to or written from).

In some of the examples described herein, operations that support techniques for access line management are described in the context of an array of memory cells having one common plate (that is, common to all memory cells of the array). It is to be understood that the same techniques described herein may be supported by an array of memory cells comprising than one common plate, where each plate may be common to a subset of memory cells of the array. Accordingly, the techniques described herein may apply in the context of a memory array having any number of plates.

In the examples described herein, the absolute voltage levels described (e.g., 3V, 0V, −1.5V, etc.) are for illustrative purposes only. Thus, any absolute voltage level(s) may be used that are different than the absolute voltage levels described herein.

Figure 5A:
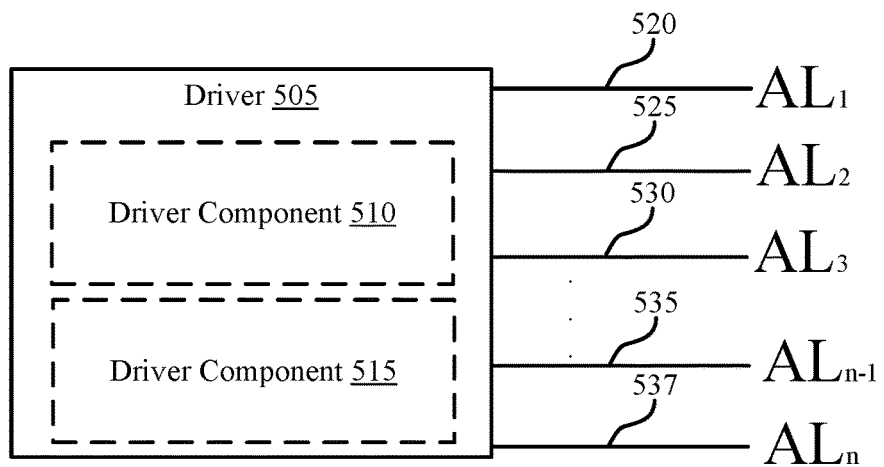
FIGS. 5A and 5B illustrate an example of a memory device and timing diagram that support techniques for access line management in accordance with examples of the present disclosure.

FIG. 5A illustrates examples of a memory device 500-a that supports techniques for access line management for an array of memory cells in accordance with examples of the present disclosure. In some examples, memory device 500-a may include driver 505, which may be referred to as memory driver 505. Memory driver 505 may be coupled with any number of access lines, and may facilitate an access operation of one or more memory cells (e.g., memory cells 305-a through 305-f as described with reference to FIG. 3). Memory driver 505 may be coupled with, for example, access line 520, access line 525, access line 530, access line 535, and access line 537. Each of access lines 520, 525, 530, 535, and 537 may be examples of a word line (e.g., word lines 310-a, 310-b as described with reference to FIG. 3) of a memory array. Memory driver 505 may include various sub-components, such as driver component 510 and driver component 515. In other examples (not shown), memory driver 505 may contain any number of sub-components (e.g., any number of driver components).

As described above, each of access lines 520, 525, 530, 535, and 537 may be examples of a word line of a memory array (e.g., memory array 320 as described with reference to FIG. 3). For example, access line 520 may be or may be referred to as a first access line 520, access line 525 may be or may be referred to as second access line 525, and access line 530 may be or may be referred to as third access line 530.

Additionally or alternatively, access line 430 and access line 435 may examples of access lines that represent a total number of access lines associated with memory device 500-*a*. For example, access line 537 may be referred to as access line "$AL_n$," where "n" is a total number of access lines associated with the memory array, and access line 535 may be referred to as access line "$AL_{n-1}$." In some examples a memory array associated with driver 505 may include 1024 access lines (e.g., word lines), thus access line 535 may represent the 1023rd access line of the memory array, and access line 537 may represent the 1024th access line of the memory array. Each of access lines 520, 525, 530, 535, and 537 may be associated with an individual memory cell— e.g., no memory cell 105 may be common across access lines 520, 525, 530, 535, and 537, regardless of whether any of access lines 520, 525, 530, 535, and 537 is associated with a single memory cell 105 or multiple memory cells 105.

In some examples, memory driver 505 may facilitate an access operation of a memory cell coupled with one of access lines 520, 525, 530, 535, and 537. For example, an access operation may be conducted on a memory cell coupled with access line 525, which may be referred to as a second memory cell. In some examples, a memory controller (e.g., memory controller 140 as described with reference to FIG. 1) may identify an access operation associated with the second memory cell. Driver 505 may then float (e.g., for a duration) first access line 520. In other examples, driver 505 may float each of access lines 520 through 537 other than access line 525. Stated another way, driver 505 may float every unselected access line associated with memory cells 105 having a common plate with the selected memory cell. By floating the unselected access lines, a voltage of each unselected access line may track a voltage of relevant the plate (e.g., plate 325 as described with reference to FIG. 3).

In some examples, driver 505 may float the unselected access lines using multiple floating operations and/or using multiple sub-components. For example, a first subset of unselected access lines may be floated using a first floating operation and/or a first combination of sub-components of driver 505, and a second subset of unselected access lines may be floated using a second floating operation and/or a second combination of sub-components of driver 505. Because driver 505 may be coupled with all but one unselected access line, depending on the size of the memory array (e.g., coupled with 1023 of 1024 unselected access lines), the first subset of unselected access lines floated using a first floating operation and/or a first combination of sub-components and the second subset of unselected access lines floated using a second floating operation and/or a second combination of sub-components may total 1023 access lines.

In some cases, a sub-component of driver 505 (e.g., driver component 510) may be common to a selected access line (e.g., access line 520) and one or more unselected access lines (e.g., access lines 525, 530), while one or more other sub-components of driver 505 (e.g., driver component 515) may be common to a plurality of other unselected access lines (e.g., access lines 535, 537). In such an example, driver component 510 may operate unselected access lines 525, 530 differently than the manner in which driver component 515 may operate unselected access lines 535, 537. For example, whereas driver component 515 may operate unselected access lines 535, 537 substantially as described in reference to FIG. 4, driver component 510 may drive (rather than float) unselected access lines 525, 530 to a voltage configured to minimize voltage stress on components (e.g., transistors) within driver component 510, as driver component 510 is common with the selected access line 520.

In the examples described above, memory driver 505 may include any number of sub-components, and each sub-component may be coupled any number of access lines. For example, memory driver 505 may include a separate driver component for each access line or may include separate driver components for each unique subset of access lines.

Figure 5B:
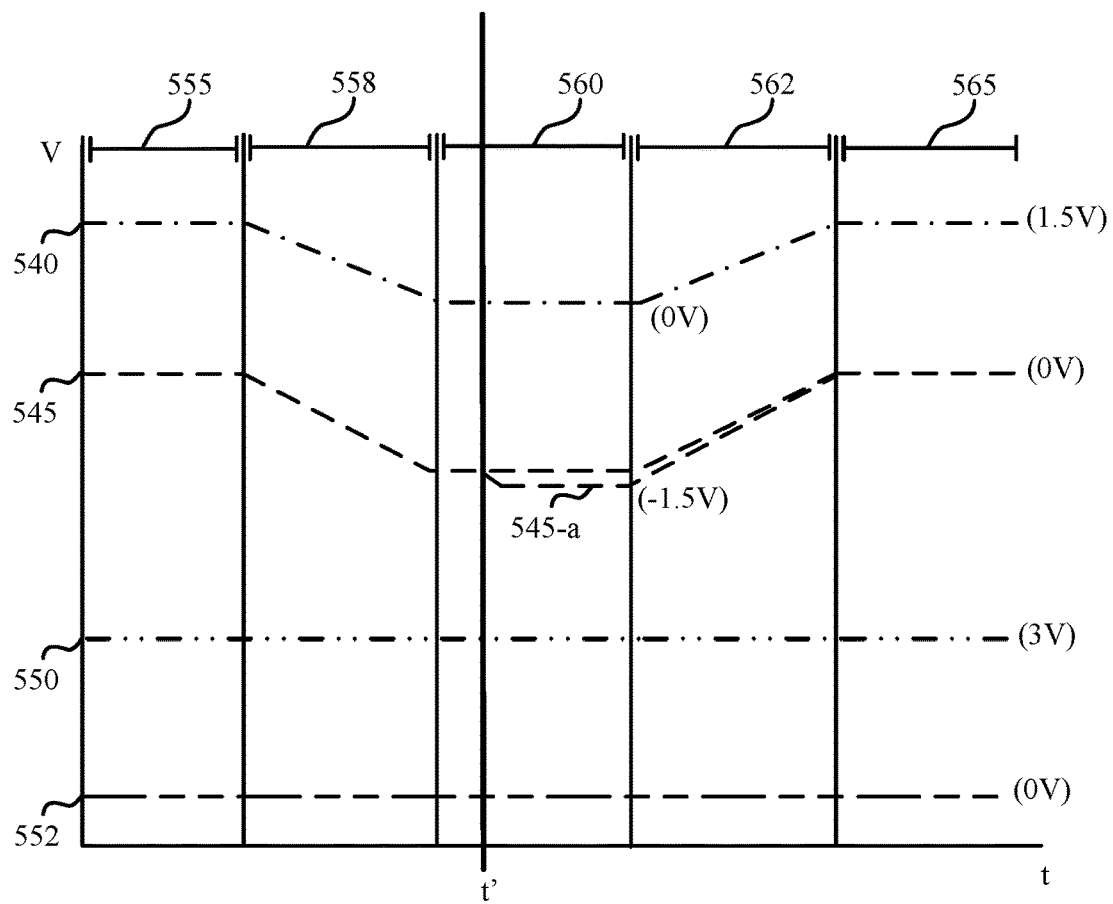

FIG. 5B illustrates an example timing diagram 500-*b* that supports techniques for access line management for an array of memory cells in accordance with examples of the present disclosure. In some examples, timing diagram 500-*b* may illustrate an access operation associated with memory device 500-*a* as described above with reference to FIG. 5A. In some examples, timing diagram 500-*b* may illustrate voltages of a plate line 540, unselected access lines 545, 545-*a*, a selected access line 550, and a subset of unselected access lines 552. Timing diagram 500-*b* may illustrate the voltages of plate line 540, unselected access line 545, 545-*a*, selected access line 550, and the subset of unselected access lines 552 during intervals 555, 558, 560, 562 and 565. In some examples, subset of unselected access lines 552 may be or may refer to unselected access lines that share one or more drivers or driver components (e.g., driver component 510 as described above with reference to FIG. 5A) with the selected access line 550.

As described above, a memory array may include a plurality of respective access lines (e.g., access lines 520, 525, 530, 535, and 537 as described above with reference to FIG. 5A) for a plurality of memory cells, each memory cell having a common plate. Each access line may be referred to as a word line and may be selected or unselected (e.g., by a driver) based on a particular access operation. Any one access line may be selected during a particular access operation, and a remaining number of access lines associated with the plate may remain unselected during the operation. For example, memory cells to which the plate is common may be associated with 1024 access lines (e.g., word lines). Thus, during an access operation, one access line associated with the memory cell to be accessed may be selected (e.g., selected access line 550), and a remaining number of access lines may remain unselected (e.g., unselected access lines 545, 545-*a*). As described above with reference to FIG. 3, a plate (e.g., plate line 540) may be coupled with the memory array.

An access operation associated with a memory cell may be identified (e.g., by a memory controller 140 as described with reference to FIG. 1). At interval 555, the plate line 540 is shown as initially driven to a first voltage (e.g., a high voltage). The selected access line 550 is shown as driven to a high voltage (e.g., 3V), and the unselected access lines 445, 552 are shown as driven to a different voltage (e.g., 0V). The unselected access lines 445 may be referred to as being at a different voltage (e.g., 0V) as the unselected lines may transition between the voltage (e.g., 0V) and a negative voltage.

At interval 558, the plate line 540 may transition from a first voltage (e.g., a high voltage) to a second voltage (e.g., a low voltage). The selected access line 550 may remain at a high value (e.g., 3V), and the unselected access lines 545 may be floated. In some examples, the unselected access lines 545 may begin being floated simultaneously with the plate line 540 transitioning to a second voltage, or the unselected access lines 545 may begin being floated before the plate line 540 transitions to a second voltage. Due to capacitive coupling between the unselected access lines and the plate line 540, floating the unselected access lines 545 may result a voltage of the unselected access lines 545 tracking a voltage of the plate line 540. Stated another way, as the voltage of the plate line 540 decreases during interval 558, it may pull down the voltage of the floating unselected access lines 545 by an equal or substantially similar amount.

For example, if the voltage of the plate line 540 decreases from 1.5V to 0V, the voltage of the unselected access lines 545 may decrease from 0V to or to approximately −1.5V. By allowing the voltage of the unselected access lines 545 to track the voltage of the plate line 540 as the voltage of the plate line 540 changes, a voltage differential between the plate line 540 and the unselected access lines 545 may remain constant or substantially constant. Thus, as the voltage of the plate line 540 changes, a leakage current (e.g., due to capacitive coupling between the plate line 540 and the unselected access lines 545) may be reduced or eliminated, and power consumption associated with the access operation may be reduced.

At interval 560, the plate line 540 may remain at the second voltage (e.g., a low voltage), and the selected access line 550 may remain at a high voltage (e.g., 3V). In some examples, the unselected access lines 545 may continue to float throughout interval 560, and the voltage of the unselected access liens 545 may thus stay at the level obtained at the end of interval 558. In such examples, the difference between the voltage of the unselected access lines 545 and the voltage of the plate line 540 during interval 560 may not be precisely what it was during interval 555. For example, if the voltage of the plate line 540 decreases from 1.5V to 0V, the voltage of the unselected access lines 545 may decrease during interval 558 from 0V to some level near but not precisely equal to −1.5V (e.g., −1.4V), and the voltage of the unselected access lines 545 may remain at that approximate level (e.g., −1.4V) throughout interval 560.

In some examples, after being floated, the unselected access lines 545 may be driven to a desired low voltage based on and compatible with voltage change of the plate line 540 during interval 458, as shown in FIG. 5B by the unselected access line 545-a. The unselected access lines 545-a may be driven to a desired voltage based on the plate voltage swing, for example, such that a subsequent voltage differential between the plate line 540 and the unselected access lines 545-a is ensured to be the same as during interval 555 (e.g., if the voltage of the plate changes from 1.5V to 0V during interval 558, and the voltage of the unselected access lines 545 was 0V during interval 555, the voltage of the unselected access lines 545 may be driven to −1.5V, to ensure a voltage differential of 1.5V).

In some examples, the unselected access lines 545-a may be driven to a desired voltage at the beginning of interval 560 (e.g., once the plate line 540 reaches the second voltage) or at some late time during interval 560 (e.g., at time t'). In other examples, the unselected access lines 545-a may be driven to a desired voltage at the onset of interval 560. Driving the unselected access lines 545 to a desired voltage such to ensure a desired voltage differential relative to the voltage of the plate line 540 (e.g., a voltage differential equal to that during interval 555) may introduce some amount of additional complexity as opposed to continuing to float the unselected access lines 545 throughout interval 460 but may further reduce leakage currents and associated power consumption as a result of change the voltage of the plate line 540 and may provide greater control over the voltage of the unselected access lines 545 during interval 560. Thus, the voltage of the unselected access lines 545 may track the voltage of the plate line 540.

At interval 562, the plate line 540 may be driven from the second voltage (e.g., from a low voltage) to the first voltage (e.g., to a high voltage). The selected access line 550 may remain at a high voltage (e.g., at 3V) and the unselected access lines 545 may be floated (either remain floating in the case it was floated throughout interval 460, or in the case of unselected access line 545-a, begin floating at or some guard period prior to the time the plate line 540 voltage begins transitioning). Because of capacitive coupling between the unselected access lines 545 and the plate line 540, floating the unselected access lines 545 may result in a voltage of the unselected access lines 545 tracking (e.g., tracking substantially) a voltage of the plate line 540. Accordingly, a voltage of the unselected access lines 545 may increase as a voltage of the plate line 540 increases. By tracking a voltage of the plate line 540, a voltage differential between a voltage of the plate line 540 and a voltage of the unselected access lines 545 may be limited. Thus a leakage current associated with the plate line 540 and the unselected access lines 545 may be mitigated, and power consumption of the associated memory device may be reduced.

At interval 565, the selected access line 550 may remain at a high voltage (e.g., 3V). The plate line 540 may return to a first voltage (e.g., a high voltage) as described at interval 555, and the unselected access lines 545 may be driven to a high voltage (e.g., 0V). As described above, the unselected access lines 545 may be referred to as being at a high voltage (e.g., 0V) due to transitioning between a high voltage (e.g., 0V) and a negative voltage.

As described above, the subset of unselected access lines 552 may be maintained at a constant voltage (e.g., 0V) throughout intervals 555, 558, 560, 562, and 565. Because the subset of unselected access lines 552 may be or may refer to unselected access lines that share one or more driver components (e.g., driver component 510 as described above with reference to FIG. 5A) with the selected access line 550, such a configuration may add additional complexity to the memory device (e.g., memory device 500-a as described with reference to FIG. 5A; as compared with memory device 400-a as described with reference to FIG. 4A). However, in some examples, such a configuration may reduce voltage stress and thus a requisite voltage tolerance of one or more transistors (e.g., one or more transistors located within the driver component) common between the unselected access lines 545, 545-a and the selected access line 550.

Additionally or alternatively, a voltage differential between the selected access line 550 and the subset of unselected access lines 552 may be less than a voltage differential between the selected access line 450 and the unselected access lines 445, 445-a as described above with reference to FIG. 4B. For example, as described above with reference to FIG. 4B, a voltage differential between the selected access line 450 and the unselected access lines 445, 445-a may be 4.5V (e.g., unselected access lines 445, 445-a at −1.5V; selected access line at 3V). As described with reference to FIG. 5B, a voltage differential between the selected access line 450 and the subset of unselected access lines 552 may be 3V (e.g., subset of unselected access lines 552 at 0V; selected access line at 3V). It is to be understood that, where a driver 505 comprises multiple driver components 510, each driver component may support operating any one corresponding access line as described with reference to selected access line 550 while operating any other corresponding access lines as described with reference to the subset of unselected access lines 552, as well as operating all corresponding access line as described with reference to unselected access lines 545, depending on whether any access line corresponding to the driver component 510 is selected.

Though shown in the example of FIG. 5B as transitioning from a high voltage to a low voltage and back to the high voltage, in some examples, the techniques described herein may apply when the plate line 540 transitions from a low voltage to a high voltage or from a high voltage to a low voltage, this may be referred to as toggling or toggling a voltage of the plate line 540. Regardless of the direction of the toggling, the unselected access lines 545, 545-a and/or the subset of unselected access lines 552 may be floated when a voltage of the plate line 540 is toggled.

In various examples, plate toggling may occur and thus unselected access lines 545, 545-a and/or the subset of unselected access lines 552 may be floated at any time associated with an access operation. For example, the unselected access lines 545, 545-a and/or the subset of unselected access lines 552 may be floated before, during, or after the selected memory cell is accessed (e.g., read to or written from).

In some of the examples described herein, operations that support techniques for access line management are described in the context of an array of memory cells having one common plate (that is, common to all memory cells of the array). It is to be understood that the same techniques described herein may be supported by an array of memory cells comprising more than one common plate, where each plate may be common to a subset of memory cells of the array. Accordingly, the techniques described herein may apply in the context of a memory array having any number of plates.

In the examples described herein, the absolute voltage levels described (e.g., 3V, 0V, −1.5V, etc.) are for illustrative purposes only. Thus, any absolute voltage level(s) may be used that are different than the absolute voltage levels described herein.

Figure 6:
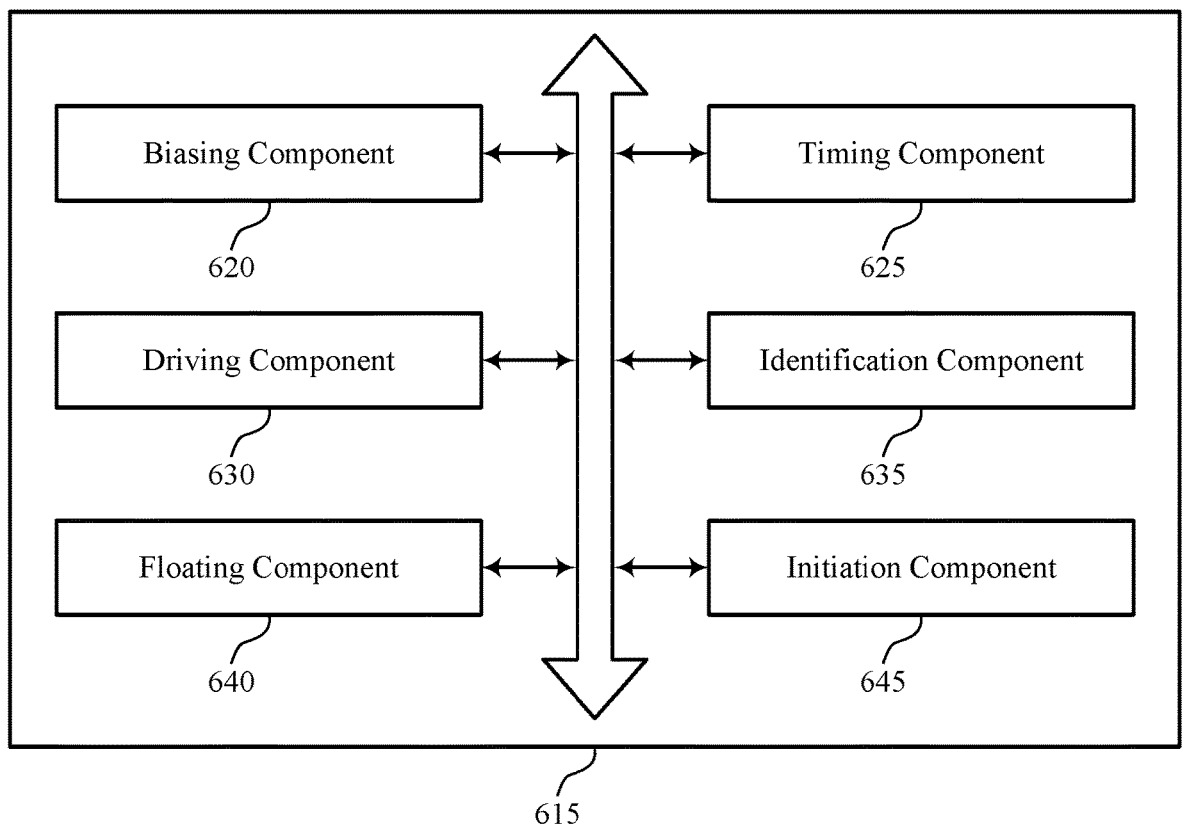
FIGS. 6 and 7 show block diagrams of a device that supports techniques for access line management in accordance with examples of the present disclosure.

FIG. 6 shows a block diagram 600 of an access line manager 615 that supports access line management for an array of memory cells in accordance with examples of the present disclosure. The access line manager 615 may be an example of aspects of an access line manager 715 described with reference to FIG. 7. The access line manager 615 may include biasing component 620, timing component 625, driving component 630, identification component 635, floating component 640, and initiation component 645. Each of these modules may communicate, directly or indirectly, with one another (e.g., via one or more buses).

Driving component 630 may drive a plate coupled with at least a first memory cell of an array of memory cells to a first voltage. In some examples, driving component 630 may drive, during the duration, the plate from the first voltage to a second voltage based on the access operation associated with the second memory cell. In other examples, driving component 630 may drive the first access line to the desired voltage after the duration based at least in part on a difference between the first voltage and the second voltage. Additionally or alternatively, driving component 630 may drive the plate from the second voltage to the first voltage. In some examples, driving component 630 may drive a second access line coupled with the second memory cell to a third voltage during the duration. In other examples, driving component 630 may drive a third access line coupled with a third memory cell to a fourth voltage during the duration while driving the plate from the first voltage to the second voltage.

Identification component 635 may identify an access operation associated with a second memory cell of the array of memory cells.

Floating component 640 may float, for a duration, a first access line coupled with the first memory cell of the array of memory cells based on the access operation associated with the second memory cell. In other examples, floating component 640 may float the first access line after driving the first access line to the desired voltage while driving the plate from the second voltage to the first voltage. In other examples, floating component 640 may float the first access line immediately subsequent to the duration. Additionally or alternatively, floating component 640 may float the first access line and drive the plate to the second voltage concurrently.

Initiation component 645 may initiate driving the third access line to a fifth voltage. The fifth voltage may be associated with a second logic value of the third memory cell. In some examples, initiation component 645 may initiate driving the plate from a first voltage to a second voltage based on the access operation associated with the second memory cell. In some examples, initiation component 645 may initiate floating the first access line based on the access operation associated with the second memory cell. Additionally or alternatively, initiation component 645 may initiate driving a third access line associated with a third memory cell of the set of memory cells to a third voltage based on the access operation associated with the second memory cell.

It is to be understood that in some instances, one or more components of access line manager 615 may be combined (e.g., biasing component 620, driving component 630, and floating component 640).

Figure 7:
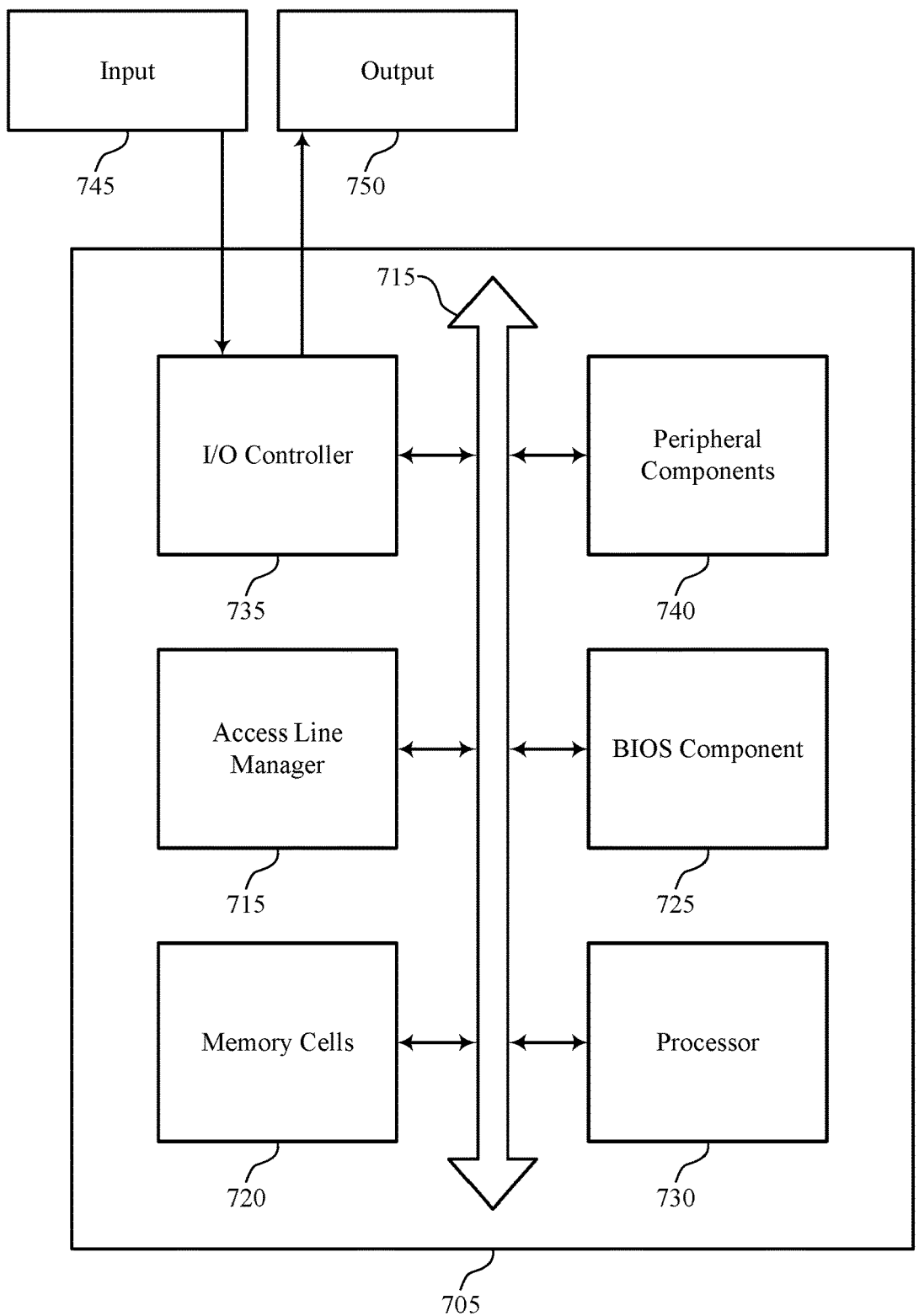

FIG. 7 shows a diagram of a system 700 including a device 705 that supports access line management for an array of memory cells in accordance with examples of the present disclosure. Device 705 may be an example of or include the components of memory array 100 as described above, e.g., with reference to FIG. 1. Device 705 may include components for bi-directional voice and data communications including components for transmitting and receiving communications, including access line manager 715, memory cells 720, basic input/output system (BIOS) component 725, processor 730, I/O controller 735, and peripheral components 740. These components may be in electronic communication via one or more buses (e.g., bus 710).

Memory cells 720 may store information (i.e., in the form of a logical state) as described herein.

BIOS component 725 be a software component that includes BIOS operated as firmware, which may initialize and run various hardware components. BIOS component 725 may also manage data flow between a processor and various other components, e.g., peripheral components, input/output control component, etc. BIOS component 725 may include a program or software stored in read only memory (ROM), flash memory, or any other non-volatile memory.

Processor 730 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 730 may be configured to operate a memory array using a memory controller. In other cases, a memory controller may be integrated into processor 730. Processor 730 may be configured to execute computer-readable instructions stored in a memory to perform various functions (e.g., functions or tasks supporting access line management for an array of memory cells).

I/O controller 735 may manage input and output signals for device 705. I/O controller 735 may also manage peripherals not integrated into device 705. In some cases, I/O controller 735 may represent a physical connection or port to an external peripheral. In some cases, I/O controller 735 may utilize an operating system such as iOS®, ANDROID®, MS-DOS®, MS-WINDOWS®, OS/2®, UNIX®, LINUX®, or another known operating system. In other cases, I/O controller 735 may represent or interact with a modem, a keyboard, a mouse, a touchscreen, or a similar device. In some cases, I/O controller 735 may be implemented as part of a processor. In some cases, a user may interact with device 705 via I/O controller 735 or via hardware components controlled by I/O controller 735.

Peripheral components 740 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 745 may represent a device or signal external to device 705 that provides input to device 705 or its components. This may include a user interface or an interface with or between other devices. In some cases, input 745 may be managed by I/O controller 735, and may interact with device 705 via a peripheral component 740.

Output 750 may also represent a device or signal external to device 705 configured to receive output from device 705 or any of its components. Examples of output 750 may include a display, audio speakers, a printing device, another processor or printed circuit board, etc. In some cases, output 750 may be a peripheral element that interfaces with device 705 via peripheral component(s) 740. In some cases, output 750 may be managed by I/O controller 735.

The components of device 705 may include circuitry designed to carry out their functions. This may include various circuit elements, for example, conductive lines, transistors, capacitors, inductors, resistors, amplifiers, or other active or inactive elements, configured to carry out the functions described herein. Device 705 may be a computer, a server, a laptop computer, a notebook computer, a tablet computer, a mobile phone, a wearable electronic device, a personal electronic device, or the like. Or device 705 may be a portion or aspect of such a device.

Figure 8:
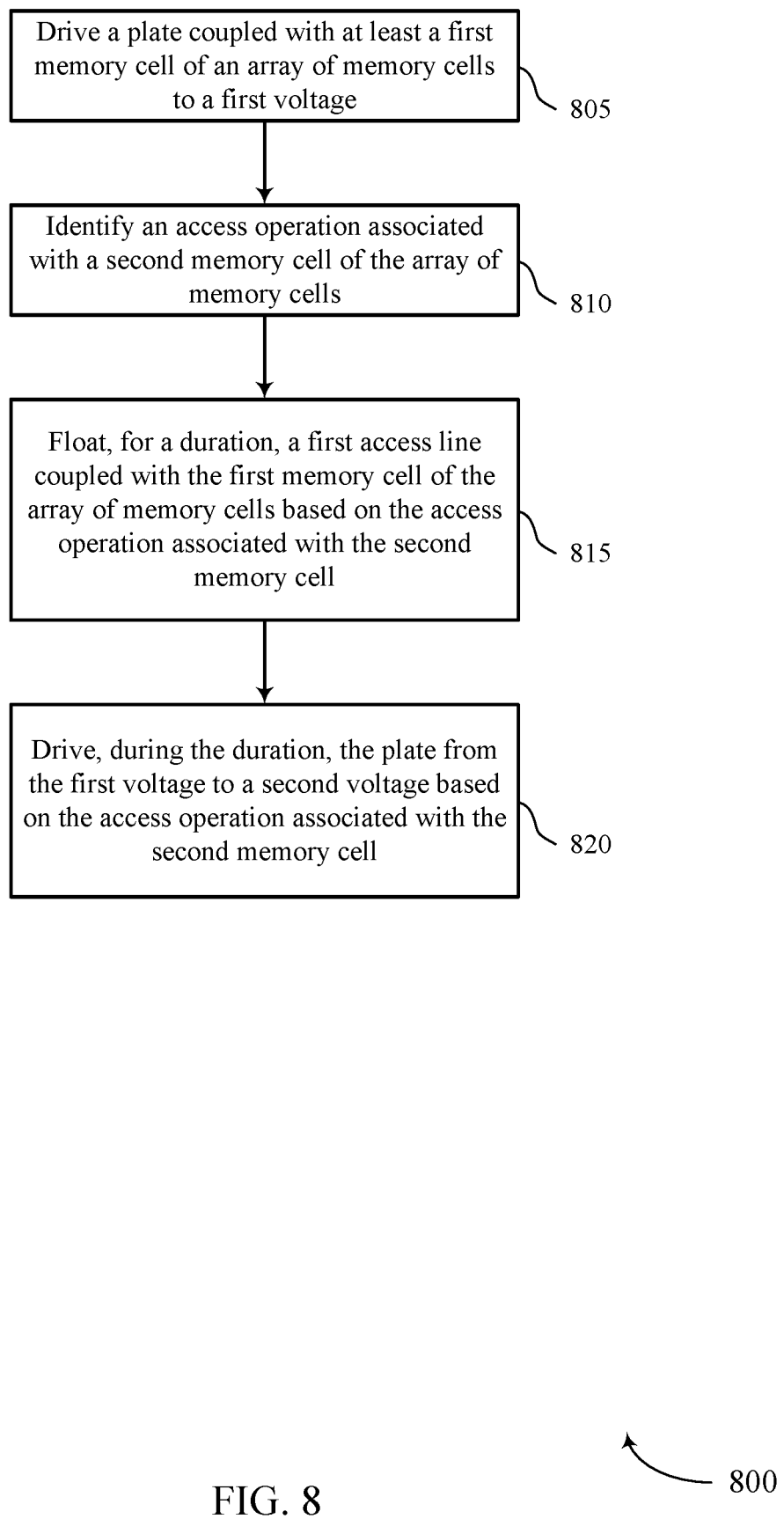
FIGS. 8 through 10 illustrate methods for access line management for an array of memory cells in accordance with examples of the present disclosure.

FIG. 8 shows a flowchart illustrating a method 800 for access line management for an array of memory cells in accordance with examples of the present disclosure. The operations of method 800 may be implemented by a memory controller its components as described herein. For example, the operations of method 800 may be performed by an access line manager as described with reference to FIG. 6.

At 805 the memory array 100 a plate coupled with at least a first memory cell of an array of memory cells may be driven to a first voltage. The operations of 805 may be performed according to the methods described herein. In certain examples, aspects of the operations of 805 may be performed by a driving component as described with reference to FIG. 6.

At 810 an access operation associated with a second memory cell of the array of memory cells may be identified. The operations of 810 may be performed according to the methods described herein. In certain examples, aspects of the operations of 810 may be performed by an identification component as described with reference to FIG. 6.

At 815 a first access line coupled with the first memory cell of the array of memory cells may be floated, for a duration, based at least in part on the access operation associated with the second memory cell. The operations of 815 may be performed according to the methods described herein. In certain examples, aspects of the operations of 815 may be performed by a floating component as described with reference to FIG. 6.

At 820 the plate may be driven, during the duration, from the first voltage to a second voltage based at least in part on the access operation associated with the second memory cell. The operations of 820 may be performed according to the methods described herein. In certain examples, aspects of the operations of 820 may be performed by a driving component as described with reference to FIG. 6.

Figure 9:
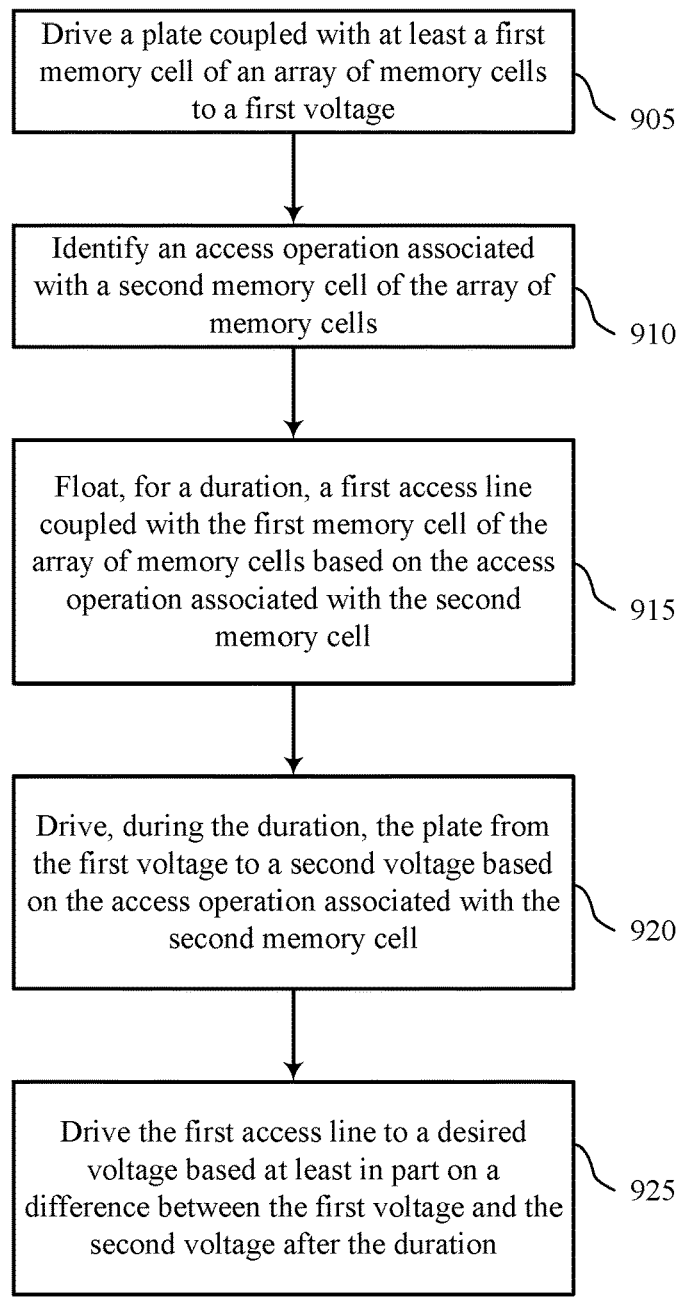

FIG. 9 shows a flowchart illustrating a method 900 for access line management for an array of memory cells in accordance with examples of the present disclosure. The operations of method 900 may be implemented by a memory controller or its components as described herein. For example, the operations of method 900 may be performed by an access line manager as described with reference to FIG. 6.

At 905 a plate coupled with at least a first memory cell of an array of memory cells may be driven to a first voltage. The operations of 905 may be performed according to the methods described herein. In certain examples, aspects of the operations of 905 may be performed by a driving component as described with reference to FIG. 6.

At 910 access operation associated with a second memory cell of the array of memory cells may be identified. The operations of 910 may be performed according to the methods described herein. In certain examples, aspects of the operations of 910 may be performed by an identification component as described with reference to FIG. 6.

At 915 a first access line coupled with the first memory cell of the array of memory cells may be floated, for a duration, based at least in part on the access operation associated with the second memory cell. The operations of 915 may be performed according to the methods described herein. In certain examples, aspects of the operations of 915 may be performed by a floating component as described with reference to FIG. 6.

At 920 the plate may be driven, during the duration, from the first voltage to a second voltage based at least in part on the access operation associated with the second memory cell. The operations of 920 may be performed according to the methods described herein. In certain examples, aspects of the operations of 920 may be performed by a driving component as described with reference to FIG. 6.

At 925 the first access line may be driven to a desired voltage after the duration based at least in part on a difference between the first voltage and the second voltage. The operations of 925 may be performed according to the methods described herein. In certain examples, aspects of the operations of 925 may be performed by a driving component as described with reference to FIG. 6.

Figure 10:
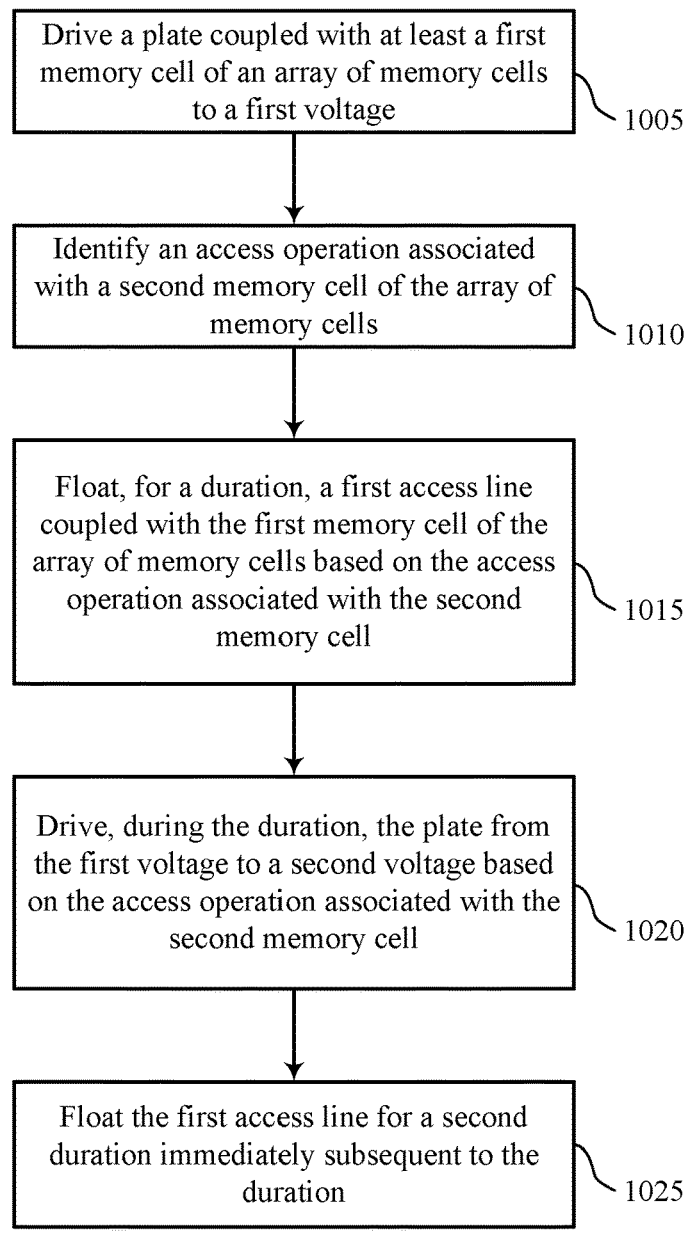

FIG. 10 shows a flowchart illustrating a method 1000 for access line management for an array of memory cells in accordance with examples of the present disclosure. The operations of method 1000 may be implemented by a memory controller or its components as described herein. For example, the operations of method 1000 may be performed by an access line manager as described with reference to FIG. 6.

At 1005 a plate coupled with at least a first memory cell of an array of memory cells may be driven to a first voltage. The operations of 1005 may be performed according to the methods described herein. In certain examples, aspects of the operations of 1005 may be performed by a driving component as described with reference to FIG. 6.

At 1010 access operation associated with a second memory cell of the array of memory cells may be identified. The operations of 1010 may be performed according to the methods described herein. In certain examples, aspects of the operations of 1010 may be performed by an identification component as described with reference to FIG. 6.

At 1015 a first access line coupled with the first memory cell of the array of memory cells may be floated, for a duration, based at least in part on the access operation associated with the second memory cell. The operations of 1015 may be performed according to the methods described herein. In certain examples, aspects of the operations of 1015 may be performed by a floating component as described with reference to FIG. 6.

At 1020 the plate may be driven, during the duration, from the first voltage to a second voltage based at least in part on the access operation associated with the second memory cell. The operations of 1020 may be performed according to the methods described herein. In certain examples, aspects of the operations of 1020 may be performed by a driving component as described with reference to FIG. 6.

At 1025 a first access line may be floated for a second duration immediately subsequent to the duration. The operations of 1025 may be performed according to the methods described herein. In certain examples, aspects of the operations of 1025 may be performed by a floating component as described with reference to FIG. 6.

In some cases, the method may include driving a plate coupled with at least a first memory cell of an array of memory cells to a first voltage. In some examples, floating the first access line and driving the plate to the second voltage may occur concurrently. In other examples, the method may include floating, for a duration, a first access line coupled with the first memory cell of the array of memory cells based at least in part on the access operation associated with the second memory cell.

In some cases, the method may include driving, during the duration, the plate from the first voltage to a second voltage based at least in part on the access operation associated with the second memory cell. In some examples, the method may include driving the first access line to the desired voltage after the duration based at least in part on a difference between the first voltage and the second voltage. Additionally or alternatively, the method may include driving the plate from the second voltage to the first voltage. In other cases, the method may include identifying an access operation associated with a second memory cell of the array of memory cells.

In some cases, the method may include driving a second access line coupled with the second memory cell to a third voltage during the duration. In some examples, the method may include driving a third access line coupled with a third memory cell to a fourth voltage during the duration while driving the plate from the first voltage to the second voltage. In some cases, the method may include floating the first access line for a second duration immediately subsequent to the duration. Additionally or alternatively, the plate may be coupled with a plurality of memory cells of the array of memory cells. The plurality of memory cells may include the first memory cell and the second memory cell.

In some cases, the plate may be coupled with multiple rows or multiple columns of memory cells of a first deck of the array of memory cells and with multiple rows or multiple columns of memory cells of a second deck of the array of memory cells. In other cases, the method may include floating the first access line after driving the plate to the second voltage while driving the plate from the second voltage to the first voltage.

Figure 11:
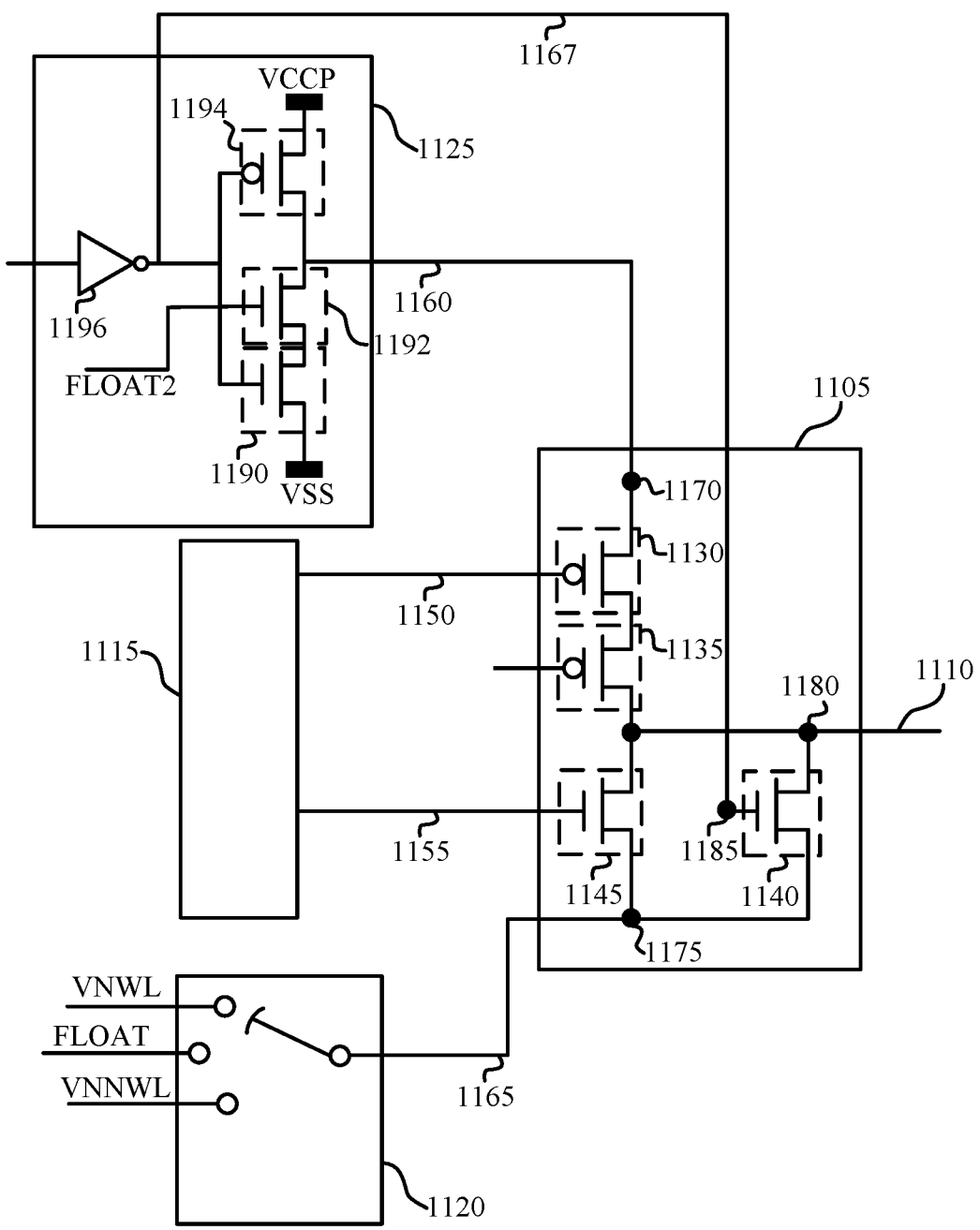
FIG. 11 illustrates examples of a circuit that supports techniques for access line management for an array of memory cells in accordance with examples of the present disclosure.

FIG. 11 illustrates examples of a circuit 1100 that supports techniques for access line management for an array of memory cells in accordance with examples of the present disclosure. In some examples, circuit 1100 may include a driver 1105, which in some cases may be an example of a word line driver. The driver 1105 may be coupled with access line 1110, which in some cases may be an example of a word line as discussed herein. The driver 1105 may facilitate an access operation of one or more memory cells coupled with access line 1110. In some examples, circuit 1100 may be coupled with or included in an access line decoder as described herein, such as a word line decoder (or row decoder) or digit line decoder (or column decoder).

The driver 1105 may be coupled with various control circuits, such as control circuit 1115, control circuit 1120, and control circuit 1125. The operations of the driver 1105 and/or control circuits 1115, 1120, and/or 1125 may facilitate an access operation of one or more memory cells as described herein. It is be understood that one or more structural or functional aspects of control circuit 1115, control circuit 1120, and control circuit 1125 may in some cases be alternatively integrated into or otherwise considered part of the driver 1105.

In some examples, the driver 1105 may represent one of a plurality of word line drivers of a memory device. For example, the driver 1105 may represent one of 1,024 word line drivers of a memory device. It is to be understood that here and elsewhere, specific numbers are used solely for illustrative clarity, and the claims are not so limited. Each driver 1105 may include one or more transistors. For example, the driver 1105 may include a transistor 1130 (e.g., a first transistor 1130) and a transistor 1135 (e.g., a second transistor 1135). The first transistor 1130 and the second transistor 1135 may be arranged in a cascode configuration. The driver 1105 may also include a transistor 1140 (e.g., a third transistor 1140) and a transistor 1145 (e.g., a fourth transistor 1145). In some examples, the first transistor 1130 and the second transistor 1135 may be PMOS transistors, and the third transistor 1140 and the fourth transistor 1145 may be NMOS transistors.

In some examples, the driver 1105 may include node 1180, which may be referred to as an output node of the driver 1105 and may be coupled with the access line 1110. Node 180 may also be coupled with a drain terminal of the second transistor 1135, a source terminal of the fourth transistor 1145, and a source terminal of the third transistor 1140.

The driver 1105 may also include one or more nodes that are configured to receive control signals from the control circuits 1115, 1120, and/or 1125. For example, the driver 1105 may include a node 1170 (e.g., a first node 1170) that is configured to receive a control signal 1160 from the control circuit 1125. The node 1170 may refer to a terminal (e.g., a source terminal) of the first transistor 1130. In some examples, the control signal 1160 may be referred to as ARFX. The driver 1105 may also include a node 1185 (e.g., a third node) that is configured to receive a control signal 1167 from the control circuit 1125. The node 1185 may refer to a gate of the third transistor 1140. In some examples, the control signal 1185 may be referred to as ARFX' and may be inverted relative to the control signal 1160.

The word line driver may also include node 1175 (e.g., a second node) that is configured to receive a control signal 1165 from the control circuit 1120. The node 1175 may refer to a terminal (e.g., a source terminal) of the third transistor 1140 and a terminal (e.g., a source terminal) of the fourth transistor 1145, which may be coupled with one another. In some examples, a state of the control signal 1165 may be based on a setting of the control circuit 1120.

In some examples, the driver 1105 may be configured to receive two control signals from the control circuit 1115. A first control signal 1150 generated by the control circuit 115 may be referred to as MWLF_H and may be received at a gate of the transistor 1130. Further, a gate of the fourth transistor 1145 may be configured to receive a second control signal 1155 from the control circuit 1115. The control signal 1155 may be referred to as MWLF_L. In some examples, the control signal 1150 may have a different (e.g., higher) voltage swing than the control signal 1155.

The control circuit 1115 illustrated in FIG. 11 may be one of a plurality of control circuits 1115 of a memory device. For example, the control circuit 1115 may represent one of sixty-four (64) control circuits 1115 of a memory device. That is, continuing the above example in which 1,024 drivers 1105 are each coupled with a respective access line 1110, a single control circuit 1115 may be coupled with sixteen (16) drivers 1105. Thus, for each control circuit 1115, the control signal 1150 and the control signal 1155 generated and output by the control circuit 1115 may be common to (received by each of) sixteen (16) drivers 1105.

In some examples, as explained above, the control signal 1150 may be applied to the gate of the transistor 1130 of the driver 1105. For example, applying the control signal 1150 to the gate of the transistor 1130 may result in the transistor 1130 being activated (e.g., turned on) when the control signal is in a low state (low voltage) or deactivated (e.g., turned off) when the control signal is in a high state (high voltage), as the transistor 1130 may be a PMOS device. Similarly, applying the control signal 1155 to the gate of the transistor 1145 may result in the transistor 1145 being activated (e.g., turned on) when the control signal is in a high state (high voltage) or deactivated (e.g., turned off) when the control signal is in a low state (low voltage), as the transistor 1145 may be an NMOS device.

The control signals 1150 and 1155 may have different voltage swings than one another. For examples, a voltage swing of the control signal 1155 may be smaller than a voltage swing of the control signal 1150 or vice versa. In some examples, each of the control signals 1150 and 1155 may be associated with a same lower bound (e.g., 0V), but may have different upper bounds. For example, the upper bound of the control signal 1150 may be 3V and the upper bound of the control signal 1155 may be 1.5V. In some examples, different control circuits 1115 of the plurality within a same device may apply different control signals to the different respective drivers 1105 during various phases of an access operation.

Configuring control circuit 1115 to generate and output to a driver 1105 two different control signals 1150 and 1155, and further with the two control signals 1150 and 1155 having different voltage swings, may in some cases avoid placing undue stress (e.g., undesirably high voltages) across one or more components (e.g., transistors) of the driver 1105, which may support the use of lower voltage tolerance device and thus may provide space, switching speed, and efficiency benefits, among other benefits that may be appreciated by one of ordinary skill in the art. Additionally or alternatively, including a transistor 1135 in a cascode configuration with the transistor 1130 may avoid placing undue stress (e.g., undesirably high voltages) across one or more components (e.g., transistors) of the driver 1105, which may support the use of lower voltage tolerance device and thus may provide space, switching speed, and efficiency benefits, among other benefits that may be appreciated by one of ordinary skill in the art.

The control circuit 1120 illustrated in FIG. 11 may be one of a plurality of control circuits 1120 of a memory device. For example, the control circuit 1120 may represent one of sixteen (16) control circuits 1120 of a memory device. That is, continuing the above example in which 1,024 drivers 1105 are each coupled with a respective access line 1110, a single control circuit 1120 may be coupled with sixty-four (64) drivers 1105. Thus, for each control circuit 1120, the control signal 1165 generated and output by the control circuit 1120 may be common to (received by each of) sixty-four (64) drivers 1105. The control circuit 1120 may be configured to apply a control signal 1165 to the respective node 1175 of each driver 1105 with which the control circuit 1120 is coupled.

In some examples, at different times during an access operation for one or more memory cells with in the memory device, the control signal 1165 may drive the node 1175 to a relatively high voltage that may be referred to as VNWL (e.g., 0V), may drive the node 1175 to a relatively low voltage that may be referred to as VNNWL (e.g., −1.5V, VNNWL), or may electrically float (e.g., FLOAT) the node 1175. The state of the control signal 1165 may be based on one or more control signals received by the control circuit 1120 (e.g., from a controller). The voltage swing between the possible voltages of the control signal 1165 may be the same as a change in voltage of a plate of the memory device during an access operation. That is, the voltage swing between the relatively high voltage and the relatively low voltage may be 1.5V, which may be the same as the change in voltage of the plate during an access operation (e.g., if the plate changes from 1.5V to 0V). In some examples, different control circuits 1120 of the plurality within a same device may apply different control signals to different respective drivers 1105 during various phases of an access operation.

The control circuit 1125 illustrated in FIG. 11 may be one of a plurality of control circuits 1125 of a memory device. For example, the control circuit 1125 may represent one of sixteen (16) control circuits 1125 of a memory device. That is, continuing the above example in which 1,024 drivers 1105 are each coupled with a respective access line 1110, a single control circuit 1125 may be coupled with sixty-four (64) drivers 1105. Thus, for each control circuit 1125, the control signals 1160 and 1167 generated and output by the control circuit 1125 may be common to (received by each of) sixty-four (64) drivers 1105. Each control circuit 1125 may be configured to apply a control signal 1160 to the respective node 1170 and/or a control signal 1167 to the respective node 1185 of each driver 1105 with which the control circuit 1125 is coupled. In some cases, a control circuit 1125 may be associated with a corresponding control circuit 1120 such that the control circuit 1125 and the corresponding control circuit 1120 may both be coupled with a same set of drivers 1105—that is, if two or more drivers 1105 are coupled with the same control circuit 1125, they may also be coupled with the same control circuit 1120.

In some examples, the control circuit 1125 may include transistors 1190, 1192, and 1194. The transistors 1190 and 1192 may be NMOS transistors, and the transistor 1194 may be a PMOS transistor. In some examples, the transistor 1190 may be arranged in a cascode configuration with the transistor 1192. In some examples, a terminal (e.g., a source terminal) of the transistor 1194 may be coupled with a first voltage source (e.g., VCCP) and a terminal (e.g., a source terminal) of the transistor 1190 may be coupled with a different voltage source (e.g., VSS). The transistors 1190, 1192, and 1194 may comprise (implement) an inverter, but with an asymmetric number of transistors on the two legs of the inverter. further, the control circuit 1125 may also include a second inverter 1196, which may be coupled with a gate of the transistor 1194 and/or the transistor 1190.

The control circuit 1125 may be configured to output (e.g., generate) the control signal 1160 and the control signal 1167. The control signals 1160 and 1167 may be logical inverses of each other (e.g., due to the inverter formed by transistors 1190, 1192, and 1194 being between the respective output nodes of control signals 1160 and 1167). That is, when one is high, the other is low.

In some examples, the control circuit 1125 may also be configured to float the node 1170 based on the FLOAT2 control signal. The FLOAT2 control signal may be received by the control circuit 1125 (e.g., from a controller) and, when active, may case the control signal 1160 to be electrically floating. In some examples, FLOAT2 may be active low, and when FLOAT2 is high, the transistors 1190, 1192, and 1194 may act as an inverter in series with the inverter 1196. But if FLOAT2 is low while the output of the inverter 1196 is high, the control signal 1160 and thus the node 1170 may be floating. For example, the node 1170 may float due to the transistor 1194 being deactivated (e.g., off) due to the output of the inverter 1196 being high and to the transistor 1192 being concurrently deactivated (e.g., off) due to FLOAT2 being low. In some examples, different control circuits 1125 of the plurality within a same device may apply different control signals to different respective drivers 1105 during various phases of an access operation.

Figure 12A:
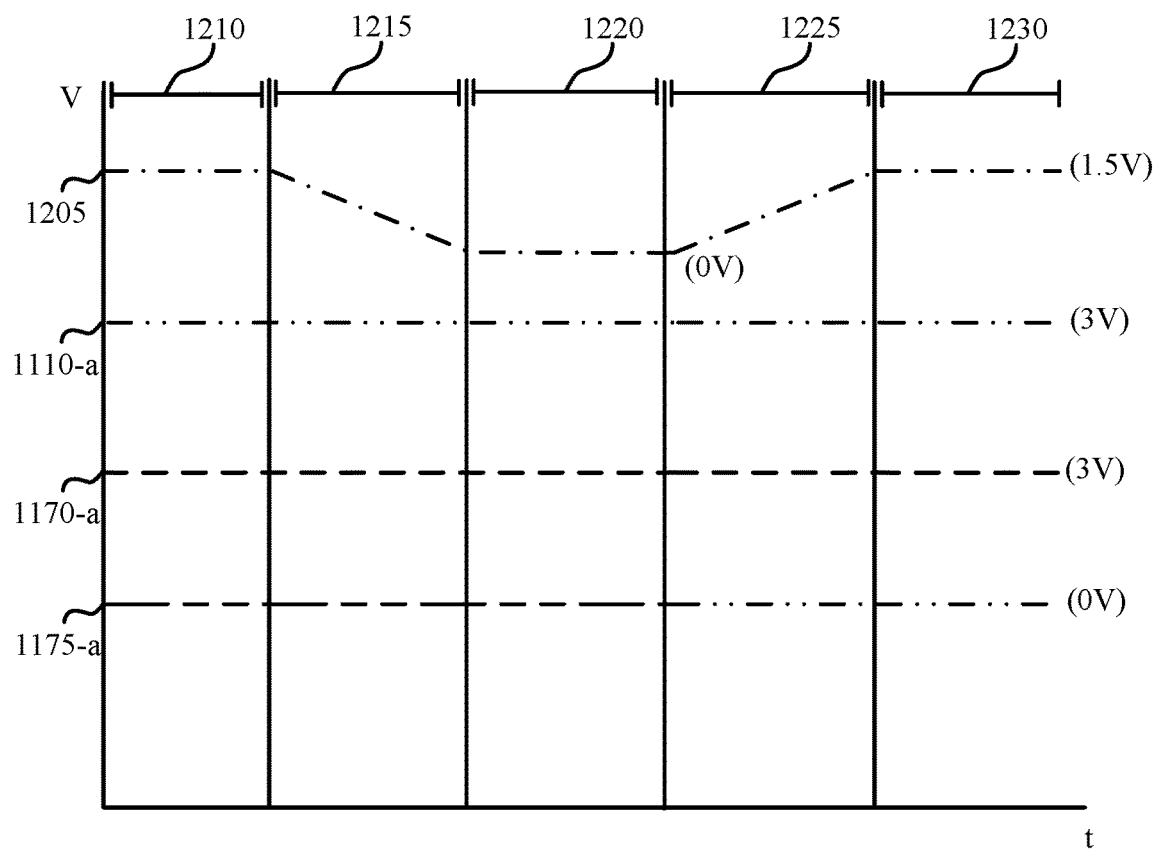
FIGS. 12A through 12D illustrate example timing diagrams that support techniques for access line management for an array of memory cells in accordance with examples of the present disclosure.

FIG. 12A illustrates an example timing diagram 1200-a that supports techniques for access line management for an array of memory cells in accordance with examples of the present disclosure. In some examples, timing diagram 1200-a may illustrate an access operation associated with (e.g., executed using) circuit 1100 as described above with reference to FIG. 11. In some examples, timing diagram 1200-a may illustrate voltages of a plate line 1205, a word line 1110-a, a node 1170-a, and a node 1175-a. The voltages of the word line 1110-a, node 1170-a, and node 1175-a may illustrate voltages applied to an access line 1110, node 1170, and node 1175 described with reference to FIG. 11. Timing diagram 1200-a may illustrate the voltages of plate line 1205, word line 1110-a, and nodes 1170-a and 1175-a during intervals 1210, 1215, 1220, 1225, and 1230.

As described herein, a memory array may include a plurality of respective access lines (e.g., a plurality of word lines) for a plurality of memory cells, each memory cell having a common plate. Each access line may be selected or unselected (e.g., by a driver 1105 as described with reference to FIG. 11) based on whether cells coupled with the access line are or are not to targeted (accessed) by a particular access operation. In some cases, any one access line of a given type may be selected during a particular access operation, and a remaining number of access lines of the same type associated with the plate may remain unselected during the operation.

The timing diagram 1200-a may illustrate an access operation associated with circuit 1100 as described above with reference to FIG. 11 for a selected access line (e.g., a selected word line). A memory cell associated with the selected access line may be accessed during one or more of the intervals illustrated in FIG. 12A.

During interval 1210, the voltage of the plate line 1205 is shown as initially driven to a first voltage (e.g., a high voltage, such as 1.5V). While the plate is driven to a first voltage, before interval 1210, the word line 1110-a may be selected. In FIGS. 12A through 12D, examples are described in terms of word lines, but it is to be understood that the teachings could be applied to any type of access line. In some examples, the word line having been selected may be represented by the voltage of the word line 1110-a being at a high voltage such as 3V at the beginning of interval 1210. In order to select the word line 1110-a, the control circuit 1125 may apply a high control signal 1160 to the node 1170 (e.g., by activating transistor 1194), which may be based on a logic high signal being received at the input of inverter 1196), and which may result in the voltage of the node 1170-a being driven to a high voltage such as 3V. While the node 1170-a is at the high voltage, the control circuit 1115 may apply a low control signal 1150 to the transistor 1130. The low control signal 1150 may be, for example, 0V. Applying the control signals 1160 and 1150 to the driver 1105 may result in the transistors 1130 and 1135 being activated (e.g., being on). Thus, the voltage of the word line 1110-a may be driven to 3V.

In some examples, the control circuit 1120 may apply a high control signal 1165 (e.g., VNWL) to the node 1175. Accordingly, a voltage of the node 1175-a may be at 0V. While the node 1175 is at 0V, the control circuit 1115 may apply a low control signal 1155 to the transistor 1145, and the control circuit 1125 may apply a low control signal 1167 to the transistor 1140. The low control signals 1155 and 1167 may be, for example, 0V. Accordingly, applying the control signals 1155 and 1167 to the driver 1105 may result in the transistors 1140 and 1145 being deactivated (e.g., being off). Thus, the word line 1110-a may be isolated from the node 1175.

During interval 1215, the voltage of the plate line 1205 may transition from the first voltage (e.g., the high voltage) to a second voltage (e.g., a low voltage, such as 0V). The voltage of the selected word line 1110-a and the voltage of the node 1170-a may remain high (e.g., at 3V), and the voltage of the node 1175-a may remain low (e.g., at 0V).

During interval 1220, the voltage of the plate line 1205 may remain at the second voltage (e.g., a low voltage, such as 0V). The voltage of the word line 1110-a and the voltage of the node 1170-a may remain high (e.g., at 3V), and the voltage of the node 1175-a may remain low (e.g., at 0V).

During interval 1225, the voltage of the plate line 1205 may be driven from the second voltage (e.g., from a low voltage) to the first voltage (e.g., to a high voltage). The voltage of the selected word line 1110-a and the voltage of the node 1170-a may remain high (e.g., at 3V), and the voltage of the node 1175-a may remain low (e.g., at 0V).

During interval 1230, voltage of the plate line 1205 may remain at the first voltage (e.g., a high voltage). The voltage of the word line 1110-*a* and the voltage of the node 1170-*a* may remain high (e.g., at 3V), and the voltage of the node 1175-*a* may remain low (e.g., at 0V). In the examples described herein, the absolute voltage levels described (e.g., 3V, 0V, −1.5V, etc.) are for illustrative purposes only. Thus, any absolute voltage level(s) may be used that are different than the absolute voltage levels described herein.

In some examples, each of the transistors 1130, 1135, 1140, and 1145 within the driver 1105 for the selected word line 1110-*a* may have a relatively low gate to source voltage (e.g., $V_{gs}$) and/or drain to source voltage (e.g., $V_{ds}$) throughout the access operation. For example, throughout the access operation, none of the transistors 1130, 1135, 1140, and 1145 have a $V_{gs}$ and/or $V_{ds}$ that is greater than the voltage swing of the control signal 1150 (e.g., MWLF_H, which may be 3V).

Figure 12B:
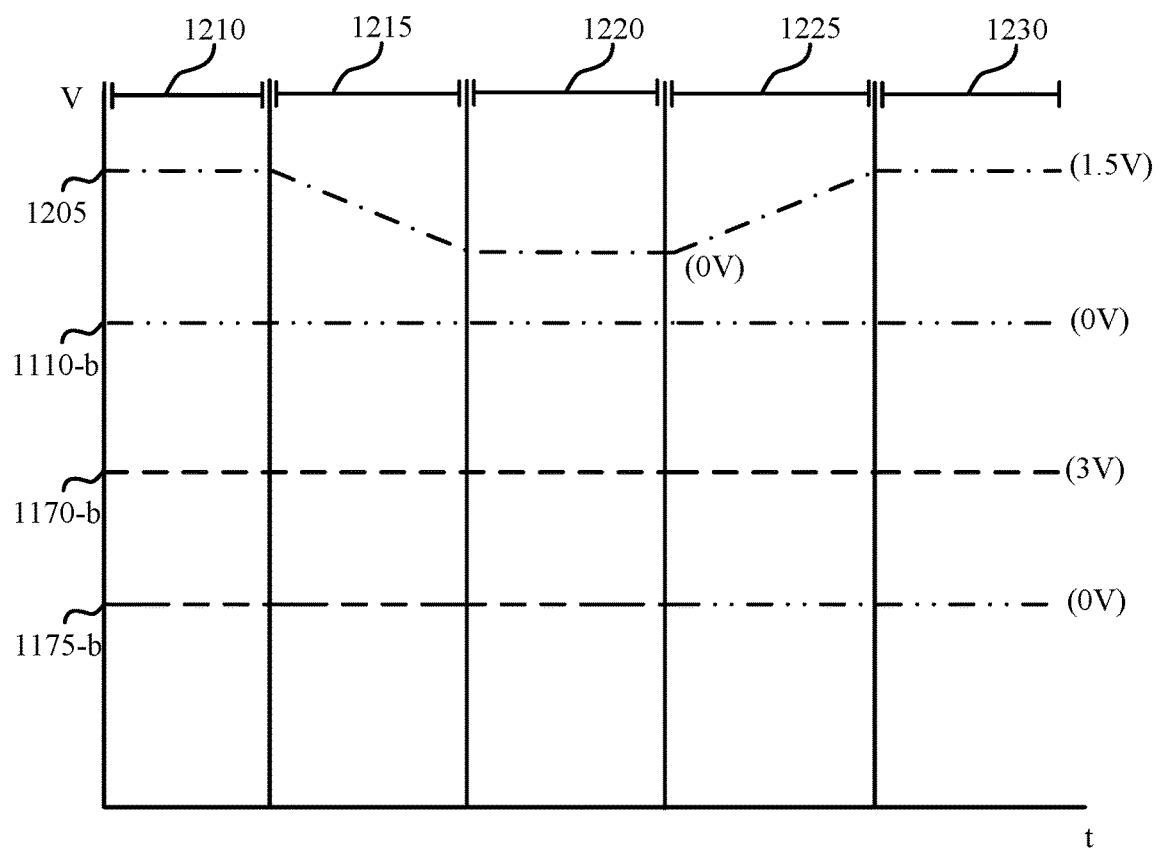

FIG. 12B illustrates an example timing diagram 1200-*b* that supports techniques for access line management for an array of memory cells in accordance with examples of the present disclosure. In some examples, timing diagram 1200-*b* may illustrate an access operation associated with (e.g., executed using) circuit 1100 as described above with reference to FIG. 11. In some examples, timing diagram 1200-*b* may illustrate voltages of a plate line 1205, a word line 1110-*b*, a node 1170-*b*, and a node 1175-*b*. The voltages of the word line 1110-*b*, node 1170-*b*, and node 1175-*b* may illustrate voltages applied to an access line 1110, node 1170, and node 1175 described with reference to FIG. 11. Timing diagram 1200-*b* may illustrate the voltages of plate line 1205, word line 1110-*b*, and nodes 1170-*b* and 1175-*b* during intervals 1210, 1215, 1220, 1225, and 1230.

As described herein, a memory array may include a plurality of respective access lines (e.g., a plurality of word lines) for a plurality of memory cells, each memory cell having a common plate. Each access line may be selected or unselected (e.g., by a driver 1105 as described with reference to FIG. 11) based on whether cells coupled with the access line are or are not targeted (accessed) by a particular access operation. In some cases, any one access line may be selected during a particular access operation, and a remaining number of access lines of the same type associated with the plate may remain unselected during the operation.

The timing diagram 1200-*b* may illustrate an access operation associated with circuit 1100 as described above with reference to FIG. 11 for a first subset of unselected access lines. For example, the timing diagram 1200-*b* may illustrate the voltages of word lines 1110-*b* that share a same control circuit 1120 and control circuit 1125 as the driver 1105 of a selected word line (e.g., a selected word line 1110-*a* as discussed with reference to FIG. 12A). Thus, continuing the above example in which 1,024 drivers 1105 are each coupled with a respective word line 1110, the voltage of the unselected word lines 1110-*b* may illustrate a voltage of 63 unselected word lines 1110 that share a same control circuit 1120 and control circuit 1125 as the driver 1105 of a selected word line.

During interval 1210, the voltage of the plate line 1205 is shown as initially driven to a first voltage (e.g., a high voltage, such as 1.5V). While the plate is driven to a first voltage, before interval 1210, one word line 1110-*a* may be selected, and a subset of word lines 1110 may remain unselected. In some examples, the subset of word lines remaining unselected may be represented by the voltage of the word lines 1110-*b* remaining at a low voltage such as 0V. When the subset of word lines 1110-*b* are unselected but share a common control circuit 1125 with the selected word line 1110-*a*, the control circuit 1125 may apply a high control signal 1160 to the node 1170, which may result in the voltage of the node 1170-*b* being driven to a high voltage such as 3V. While the node 1170-*b* is at the high voltage, the control circuit 1115—which may not be common with the selected word line 1110-*a* and the first subset of unselected words lines 1110-*b*—may apply a high control signal 1150 to the transistor 1130. The high control signal 1150 may be, for example, 3V. Accordingly, applying the control signals 1160 and 1150 to the driver 1105 may result in the transistors 1130 and 1135 being deactivated (e.g., being off). Thus, the unselected word lines 1110-*b* may be isolated from the node 1170.

In some examples (e.g., when the subset of word lines 1110-*b* are unselected but share a common control circuit 1120 with the selected word line 1110-*a*), the control circuit 1120 may apply a high control signal 1165 (e.g., VNWL) to the node 1175. For example, a voltage of the node 1175-*a* may be at 0V. While the control signal 1165 is being applied to the node 1175, the control circuit 1115 may apply a high control signal 1155 to the transistor 1145, and the control circuit 1125 may apply a low control signal 1167 to the transistor 1140. The high control signal 1155 may be, for example, 1.5V and the low control signal 1167 may be 0V. Accordingly, applying the control signals 1155 and 1167 to the driver 1105 may result in the transistor 1145 being activated (e.g., being on) and the transistor 1140 being deactivated (e.g., being off). Thus, the unselected word lines may be coupled with the node 1175 via the transistor 1145, which may result in the node 1175 and the unselected word lines having the same voltage (e.g., 0V).

During interval 1215, the voltage of the plate line 1205 may transition from the first voltage (e.g., the high voltage) to a second voltage (e.g., a low voltage, such as 0V). The voltage of the unselected word lines 1110-*b* may remain low (e.g., at 0V), the voltage of the node 1170-*a* may remain high (e.g., at 3V), and the voltage of the node 1175-*a* may remain low (e.g., at 0V).

During interval 1220, the voltage of the plate line 1205 may remain at a second voltage (e.g., a low voltage, such as 0V). The voltage of the unselected word lines 1110-*b* may remain low (e.g., at 0V), the voltage of the node 1170-*a* may remain high (e.g., at 3V), and the voltage of the node 1175-*a* may remain low (e.g., at 0V).

During interval 1225, the voltage of the plate line 1205 may be driven from the second voltage (e.g., from a low voltage) to the first voltage (e.g., to a high voltage). The voltage of the unselected word lines 1110-*b* may remain low (e.g., at 0V), the voltage of the node 1170-*a* may remain high (e.g., at 3V), and the voltage of the node 1175-*a* may remain low (e.g., at 0V).

During interval 1230, voltage of the plate line 1205 may remain at the first voltage (e.g., a high voltage). The voltage of the unselected word lines 1110-*b* may remain low (e.g., at 0V), the voltage of the node 1170-*a* may remain high (e.g., at 3V), and the voltage of the node 1175-*a* may remain low (e.g., at 0V). In the examples described herein, the absolute voltage levels described (e.g., 3V, 0V, −1.5V, etc.) are for illustrative purposes only. Thus, any absolute voltage level(s) may be used that are different than the absolute voltage levels described herein.

In some examples, each of the transistors 1130, 1135, 1140, and 1145 within the drivers 1105 for the unselected word lines 1110-*b* may have a relatively low gate to source voltage (e.g., $V_{gs}$) and/or drain to source voltage (e.g., $V_{ds}$) throughout the access operation. For example, throughout the access operation, none of the transistors 1130, 1135, 1140, and 1145 have a $V_{gs}$ and/or $V_{ds}$ that is greater than the voltage swing of the control signal 1150 (e.g., MWLF_H, which may be 3V).

Figure 12C:
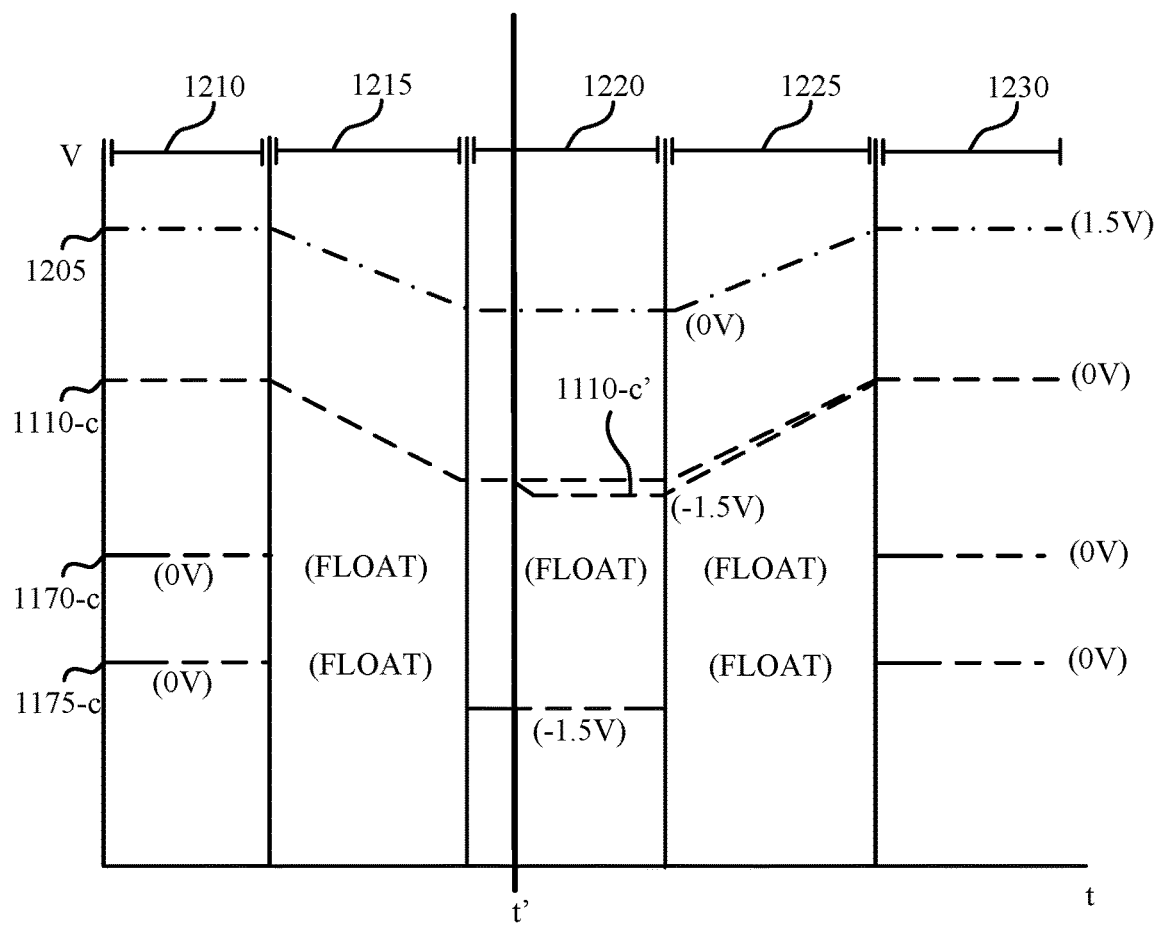

FIG. 12C illustrates an example timing diagram 1200-c that supports techniques for access line management for an array of memory cells in accordance with examples of the present disclosure. In some examples, timing diagram 1200-c may illustrate an access operation associated with (e.g., executed using) circuit 1100 as described above with reference to FIG. 11. In some examples, timing diagram 1200-c may illustrate voltages of a plate line 1205, a word line 1110-c, a node 1170-c, and a node 1175-c. The timing diagram 1200-c may also illustrate an alternative voltage of the word line 1110-c, as shown by the voltage trace denoted 1110-c'. The voltages of the word line 1110-c, node 1170-c, and node 1175-c may illustrate voltages applied to a word line 1110, node 1170, and node 1175 described with reference to FIG. 11. Timing diagram 1200-c may illustrate the voltages of plate line 1205, word line 1110-c, and nodes 1170-c and 1175-c during intervals 1210, 1215, 1220, 1225, and 1230.

As described herein, a memory array may include a plurality of respective access lines (e.g., a plurality of word lines) for a plurality of memory cells, each memory cell having a common plate. Each access line may be selected or unselected (e.g., by a driver 1105 as described with reference to FIG. 11) based on whether cells coupled with the access line are or are not targeted (accessed) by a particular access operation. In some cases, any one access line may be selected during a particular access operation, and a remaining number of access lines of a same type associated with the plate may remain unselected during the operation.

The timing diagram 1200-c may illustrate an access operation associated with circuit 1100 as described above with reference to FIG. 11 for a subset of unselected access lines. For example, the timing diagram 1200-c may illustrate the voltages of word lines 1110-c that share a different control circuit 1115, different control circuit 1120, and different control circuit 1125 than the driver 1105 of a selected access line (e.g., a selected word line 1110-a as discussed with reference to FIG. 12A). Thus, continuing the above example in which 1,024 drivers 1105 are each coupled with a respective word line 1110, the voltage of the unselected word lines 1110-c may illustrate a voltage of 945 unselected word lines 1110.

During interval 1210, the voltage of the plate line 1205 is shown as initially driven to a first voltage (e.g., a high voltage, such as 1.5V). While the plate is driven to a first voltage, before interval 1210, a subset of word lines 1110-c may remain unselected. In some examples, the word lines 1110-c remaining unselected may be represented by the voltage of the word lines 1110-c remaining at a low voltage such as 0V. When the subset of word lines are unselected and do not share a common control circuit 1125 with the selected word line 1110-a, the control circuit 1125 may apply a low control signal 1160 to the node 1170, which may result in the voltage of the node 1170-c being driven to a low voltage such as 0V. While the node 1170-c is at the low voltage, the control circuit 1115 may apply a high control signal 1150 to the transistor 1130. The high control signal 1150 may be, for example, 3V. Accordingly, applying the control signals 1160 and 1150 to the driver 1105 may result in the transistors 1130 and 1135 being deactivated (e.g., being off). Thus, the unselected word lines may be isolated from the node 1170.

In some examples, the control circuit 1115 may apply a high control signal 1155 to the transistor 1145, and the control circuit 1125 may apply a high control signal 1167 to the node 1185. In some examples, the high control signal 1155 may be 1.5V and the high control signal 1167 may be 1.5V. Accordingly, the transistor 1145 may be activated (e.g., on) and the transistor 1140 may be activated (e.g., on). The unselected word lines 1110-c may thus be coupled with the node 1175 via the transistor 1140 and the transistor 1145, and may be a same voltage as the output of the control circuit 1120 (e.g., a same voltage as a voltage of the control signal 1165). During interval 1210, the control circuit 1120 may output a control signal 1165 corresponding to VNWL which may be, for example, 0V. Accordingly, during interval 1210, the voltage of the node 1175-c and the voltage of the unselected word lines 1110-c may be at 0V.

During interval 1215, the voltage of the plate line 1205 may transition from the first voltage (e.g., the high voltage) to a second voltage (e.g., a low voltage, such as 0V). In some cases, during interval 1215, the node 1170 may also be floated, which may result in the voltage of the node 1170-c floating. For example, the control circuit 1125 may receive a FLOAT2 control signal at the gate of transistor 1192, which may be low while an input to the inverter 1196 is low, which may cause the control signal 1160 and thus the node 1170 to float. The node 1170 may float due to the transistor 1194 being deactivated (e.g., being off) due to the output of the inverter 1196 being high and the transistor 1192 being deactivated (e.g., off) due to FLOAT2 being low.

The control circuit 1120 may float control signal 1165 and thus the node 1175 during interval 1215. Due to being isolated from the node 1170 and the node 1175 being floated, the unselected word lines 1110-c may be floating. And due to capacitive coupling between the unselected word lines 1110 and the plate line 1205, floating the unselected word lines 1110 may result in a voltage of the unselected word lines 1110 tracking a voltage of the plate line 1205. Stated another way, as the voltage of the plate line 1205 decreases during interval 1215, it may pull down the voltage of floating unselected word lines 1110 by an equal or substantially similar amount. For example, if the voltage of the plate line 1205 decreases from 1.5V to 0V, the voltage of the unselected access lines 1105 may decrease from 0V to or approximately to −1.5V.

Accordingly, during interval 1215, the unselected access lines 1105 may be floated by adjusting the control signal 1165 applied to the node 1175. For example, the control circuit 1120 may output a FLOAT control signal 1165, which may float the unselected word lines 1110. Thus, a voltage of the unselected word lines 1110-c may decrease to, for example, −1.4V.

During interval 1220, the voltage of the plate line 1205 may remain at the second voltage (e.g., a low voltage, such as 0V). In some examples, the unselected word lines 1110-c may remain floating based on the control signal 1165 being applied to the node 1175.

In other examples, the unselected word lines 1110-c may be driven to a desired voltage during interval 1220 (e.g., may be driven to a voltage such that a voltage differential between the unselected word lines 1110-c during interval 1220 and the unselected word lines 1110-c during interval 1210 is equal to a voltage differential between the plate during interval 1220 and the plate during interval 1210). For example, during interval 1220 (e.g., at time t', which may be before, concurrent with, or after the beginning of interval 1220), a different control signal 1165 may be applied to the node 1175. The control signal 1165 may be VNNWL, which may be −1.5V. Accordingly, due to the unselected word lines 1110-c being coupled with the node 1175, a voltage of the unselected word lines 1110-c may be driven to −1.5V, which in some cases may be slightly different than the voltage of the unselected word lines 1110-c if floated throughout interval 1220, as shown by the alternative voltage trace associated with 1110-c' in FIG. 12C.

In some cases, during interval 1220, the node 1170 may continue to be floated as it was during interval 1215. In other examples, the node 1170 may be driven to a low voltage during interval 1220, such as 0V. Due to potential capacitive coupling between the unselected word lines 1110 and the plate 1205, a voltage of the node 1170-c may have changed (drifted) slightly (e.g., decreased to a voltage slightly below 0V) during interval 1215, and the node 1170 may be driven during interval 1220 to either 0V or to a different voltage based on the expected drift during interval 1215.

During interval 1225, the voltage of the plate line 1205 may be driven from the second voltage (e.g., from a low voltage) to the first voltage (e.g., to a high voltage). The control circuit 1120 may output a FLOAT control signal 1165, which may float the unselected word lines 1110 as described above with reference to interval 1215. Thus, a voltage of the unselected word lines 1110-c may increase to, for example, −0.1V. Additionally, the control circuit 1125 may float (e.g., continue to float) the node 1170 as described with reference to interval 1215.

During interval 1230, voltage of the plate line 1205 may remain at the first voltage (e.g., a high voltage). The control circuit 1120 may output high control signal 1165 (e.g., VNWL) which may be, for example, 0V. Accordingly, during interval 1230, the voltage of the node 1175-c and the voltage of the unselected word lines 1110-c may be at 0V. Additionally or alternatively, during interval 1230, the node 1170-c may be driven to 0V. In the examples described herein, the absolute voltage levels described (e.g., −1.4 V, −1.5V, 3V, 0V, etc.) are for illustrative purposes only. Thus, any absolute voltage level(s) may be used that are different than the absolute voltage levels described herein.

In some examples, each of the transistors 1130, 1135, 1140, and 1145 within the drivers 1105 for the unselected word lines 1110-c may have a relatively low gate to source voltage (e.g., $V_{gs}$) and/or drain to source voltage (e.g., $V_{ds}$) throughout the access operation. For example, throughout the access operation, none of the transistors 1130, 1135, 1140, and 1145 have a $V_{gs}$ and/or $V_{ds}$ that is greater than the voltage swing of the control signal 1150 (e.g., MWLF_H, which may be 3V).

Additionally or alternatively, the cascode configuration of the transistors 1130 and 1135 may result in the transistor 1130 having a relatively lower gate to source voltage (e.g., $V_{gs}$) when the plate line 1205 is at a low voltage (e.g., 0V) and the unselected access lines 1105 are at a low voltage (e.g., −1.4V). Further, because the control signals 1167 and 1155 may have a relatively low voltage swing, the transistor 1145 may avoid excess $V_{gs}$ when the plate line 1205 is at a low voltage (e.g., at 0V) and the unselected access lines 1105 are at a low voltage (e.g., −1.4V).

Figure 12D:
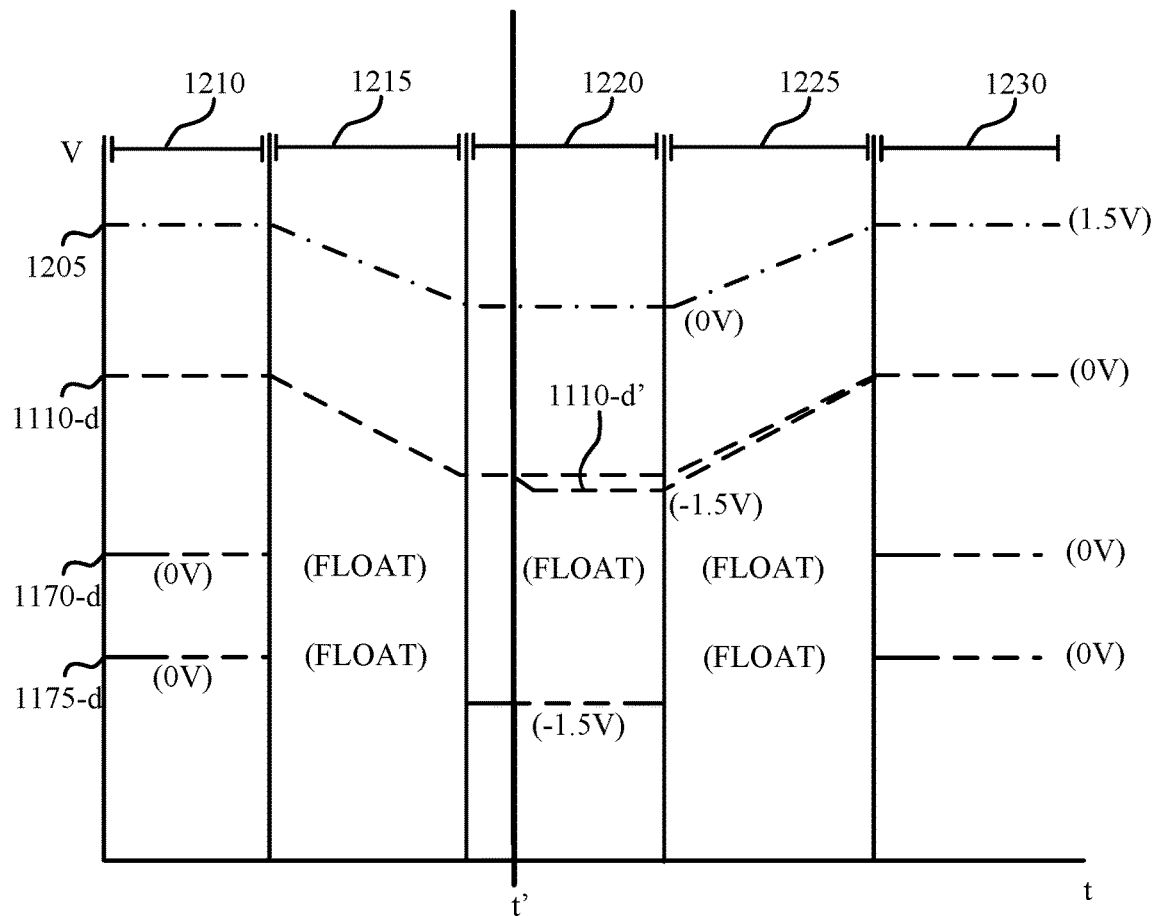

FIG. 12D illustrates an example timing diagram 1200-d that supports techniques for access line management for an array of memory cells in accordance with examples of the present disclosure. In some examples, timing diagram 1200-d may illustrate an access operation associated (e.g., executed using) with circuit 1100 as described above with reference to FIG. 11. In some examples, timing diagram 1200-d may illustrate voltages of a plate line 1205, a word line 1110-d, a node 1170-d, and a node 1175-d. The timing diagram 1200-d may also illustrate an alternative voltage of the word line 1110-d, as shown by the voltage trace denoted 1110-d'. The voltages of the word line 1110-d and 1110-d', node 1170-d, and node 1175-d may illustrate voltages applied to a word line 1110, node 1170, and node 1175 described with reference to FIG. 11. Timing diagram 1200-d may illustrate the voltages of plate line 1205, word line 1110-d (and word line 1110-d'), and nodes 1170-d and 1175-d during intervals 1210, 1215, 1220, 1225, and 1230.

As described herein, a memory array may include a plurality of respective access lines (e.g., a plurality of word lines) for a plurality of memory cells, each memory cell having a common plate. Each access line may be selected or unselected (e.g., by a driver 1105 as described with reference to FIG. 11) based on whether cells coupled with the access line are or are not targeted (accessed) by a particular access operation. Any one access line may be selected during a particular access operation, and a remaining number of access lines of the same type associated with the plate may remain unselected during the operation.

The timing diagram 1200-d may illustrate an access operation associated with circuit 1100 as described above with reference to FIG. 11 for a subset of unselected access lines. For example, the timing diagram 1200-d may illustrate the voltages of word lines 1110-d (and/or 1110-d') that share a same control circuit 1115 as the driver 1105 of a selected access line (e.g., a selected word line 1110-a as discussed with reference to FIG. 12A). Thus, continuing the above example in which 1,024 drivers 1105 are each coupled with a respective word line 1110, the voltage of the unselected word lines 1110-d may illustrate a voltage of fifteen (15) unselected word lines 1110.

During interval 1210, the voltage of the plate line 1205 is shown as initially driven to a first voltage (e.g., a high voltage, such as 1.5V). While the plate is driven to a first voltage, before interval 1210, a subset of word lines 1110 may remain unselected. In some examples, the unselected word lines 1110-d remaining unselected may be represented by the voltage of the word lines 1110-d remaining at a low voltage such as 0V. When the subset of word lines 1110-d are unselected and do not share a control circuit 1125 with the selected word line 1110-a, the control circuit 1125 may apply a low control signal 1160 to the node 1170, which may result in the voltage of the node 1170-d being driven to a low voltage such as 0V. While the node 1170-d is at the low voltage, when the subset of word lines 1110-d are unselected and share a control circuit 1115 with the selected word line 1110-a, the control circuit 1115 may apply a low control signal 1150 to the transistor 1130. The low control signal 1150 may be, for example, 0V. Accordingly, applying the control signals 1160 and 1150 to the driver 1105 may result in the transistors 1130 and 1135 being deactivated (e.g., being off). Thus, the unselected word lines may be isolated from the node 1170.

In some examples, when the subset of word lines 1110-d are unselected and share a control circuit 1115 with the selected word line 1110-a, the control circuit 1115 may apply a low control signal 1155 to the transistor 1145, and the control circuit 1125 may apply a high control signal 1167 to the node 1185. In some examples, the low control signal 1155 may be 0V and the high control signal 1167 may be 1.5V. Accordingly, the transistor 1145 may be deactivated (e.g., off) and the transistor 1140 may be activated (e.g., on). The unselected word lines 1110-d may thus be coupled with the node 1175 via the transistor 1140, and may be a same voltage as the output of the control circuit 1120 (e.g., a same voltage as a voltage of the control signal 1165). During interval 1210, the control circuit 1120 may output a control signal 1165 corresponding to VNWL which may be, for example, 0V. Accordingly, during interval 1210, the voltage of the node 1175-*d* and the voltage of the unselected word lines 1110-*d* may be at 0V.

During interval 1215, the voltage of the plate line 1205 may transition from the first voltage (e.g., the high voltage) to a second voltage (e.g., a low voltage, such as 0V). Due to capacitive coupling between the unselected word lines 1110 and the plate line 1205, floating the unselected word lines 1110 may result in a voltage of the unselected word lines 1110 tracking a voltage of the plate line 1205. Stated another way, as the voltage of the plate line 1205 decreases during interval 1215, it may pull down the voltage of floating unselected word lines 1110 by an equal or substantially similar amount. For example, if the voltage of the plate line 1205 decreases from 1.5V to 0V, the voltage of the unselected access lines 1105 may decrease from 0V to or approximately to −1.5V.

Accordingly, during interval 1215, the unselected access lines 1105 may be floated by applying a different control signal 1165 to the node 1175. For example, the control circuit 1120 may output a FLOAT control signal 1165, which may float the unselected word lines 1110. Thus a voltage of the unselected word lines 1110-*d* may decrease to, for example, —1.4V.

In some cases, during interval 1215, the node 1170 may also be floated. For example, the control circuit 1125 may receive a FLOAT2 control signal at the gate of transistor 1192, which may be low while an input to the inverter 1196 is low, which may cause the control signal 1160 and thus the node 1170 to float. The node 1170 may float due to the transistor 1194 being deactivated (e.g., being off) due to the output of the inverter 1196 being high and the transistor 1192 being deactivated (e.g., off) due to FLOAT2 being low.

During interval 1220, the voltage of the plate line 1205 may remain at a second voltage (e.g., a low voltage, such as 0V). In some examples, the unselected word lines 1110-*d* may remain floating based on the control signal 1165 being applied to the node 1175. In other examples, the unselected word lines 1110 may be driven to a desired voltage during interval 1220. For example, during interval 1220 (e.g., at time t′), a different control signal 1165 may be applied to the node 1175. The control signal 1165 may be VNNWL, which may be −1.5V.

In some cases, during interval 1220, the node 1170 may continue to be floated as it was during interval 1215. In other examples, the node 1170 may be driven to a low voltage during interval 1220, such as 0V. Due to potential capacitive coupling between the unselected word lines 1110 and the plate 1205, a voltage of the node 1170-*d* may have changed (drifted) slightly (e.g., decreased to a voltage slightly below 0V) during interval 1215, and the node 1170 may be driven during interval 1220 to either 0V or to a different voltage based on the expected drift during interval 1215.

During interval 1225, the voltage of the plate line 1205 may be driven from the second voltage (e.g., from a low voltage) to the first voltage (e.g., to a high voltage). The control circuit 1120 may output a FLOAT control signal 1165, which may float the unselected word lines 1110. Additionally, the control circuit 1125 may float (e.g., continue to float) the node 1170 as described with reference to interval 1215. During interval 1225, a voltage of the unselected word lines 1110-*d* (or 1110-*d*′) may increase to, for example, −0.1V.

During interval 1230, voltage of the plate line 1205 may remain at the first voltage (e.g., a high voltage). The control circuit 1120 may output high control signal 1165 (e.g., VNWL) which may be, for example, 0V. Accordingly, during interval 1230, the voltage of the node 1175-*d* and the voltage of the unselected word lines 1110-*d* (and 1110-*d*′) may be at 0V. Additionally or alternatively, during interval 1230, the node 1170-*d* may be driven to 0V. In the examples described herein, the absolute voltage levels described (e.g., −1.4 V, −1.5V, 3V, 0V, etc.) are for illustrative purposes only. Thus, any absolute voltage level(s) may be used that are different than the absolute voltage levels described herein.

In some examples, each of the transistors 1130, 1135, 1140, and 1145 within the drivers 1105 for the unselected word lines 1110-*d* may have a relatively low gate to source voltage (e.g., $V_{gs}$) and/or drain to source voltage (e.g., $V_{ds}$) throughout the access operation. For example, throughout the access operation, none of the transistors 1130, 1135, 1140, and 1145 have a $V_{gs}$ and/or $V_{ds}$ that is greater than the voltage swing of the control signal 1150 (e.g., MWLF_H, which may be 3V).

Additionally or alternatively, the cascode configuration of the transistors 1130 and 1135 may result in the transistor 1130 having a relatively lower gate to source voltage (e.g., $V_{gs}$) when the plate line 1205 is at a low voltage (e.g., 0V) and the unselected access lines 1105 are at a low voltage (e.g., −1.4V). Further, because the control signals 1167 and 1155 may have a relatively low voltage swing, the transistor 1145 may avoid excess $V_{gs}$s when the plate line 1205 is at a low voltage (e.g., at 0V) and the unselected access lines 1105 are at a low voltage (e.g., −1.4V).

Figure 13:
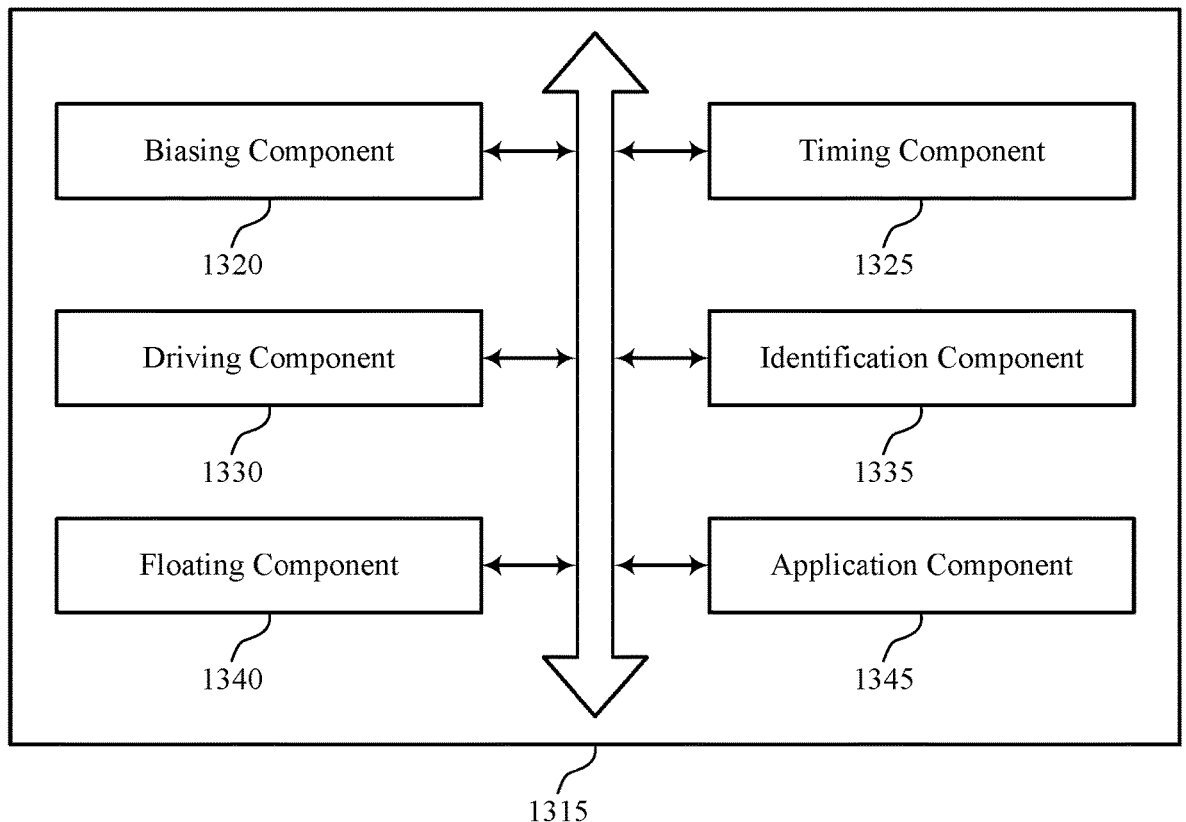
FIG. 13 illustrates a block diagram of an access line manager that supports access line management for an array of memory cells in accordance with examples of the present disclosure.

FIG. 13 shows a block diagram 1300 of an access line manager 1315 that supports access line management for an array of memory cells in accordance with examples of the present disclosure. The access line manager 1315 may be an example of aspects of an access line manager 1415 described with reference to FIG. 14. The access line manager 1315 may include biasing component 1320, timing component 1325, driving component 1330, identification component 1335, floating component 1340, and application component 1345. Each of these modules may communicate, directly or indirectly, with one another (e.g., via one or more buses).

Driving component 1330 may drive a plate coupled with at least a first memory cell of an array of memory cells to a first voltage. In some examples, driving component 1330 may drive the plate from a first voltage to a second voltage, during a duration, based on an access operation associated with a second memory cell.

Identification component 1335 may identify an access operation associated with a second memory cell of the array of memory cells.

Floating component 1340 may float, for a duration, a first access line coupled with the first memory cell of the array of memory cells based on the access operation associated with the second memory cell. In other examples, floating component 1340 may float the first access line based on applying a first control signal having a first voltage swing and a second control signal having a second voltage swing different than the first voltage swing to a driver for the first access line.

In some examples, floating component 1340 may float, for at least a portion of the duration, a second node of the driver. The second node may include a source or a drain of a fourth transistor included in the driver. Floating the first access line may be based on floating the second node.

Application component 1345 may apply a fourth control signal to a third transistor included in the driver. The fourth control signal may be inverted relative to and has a different voltage swing than the third control signal.

It is to be understood that in some instances, one or more components of access line manager 1315 may be combined (e.g., biasing component 1320, driving component 1330, and floating component 1340).

Figure 14:
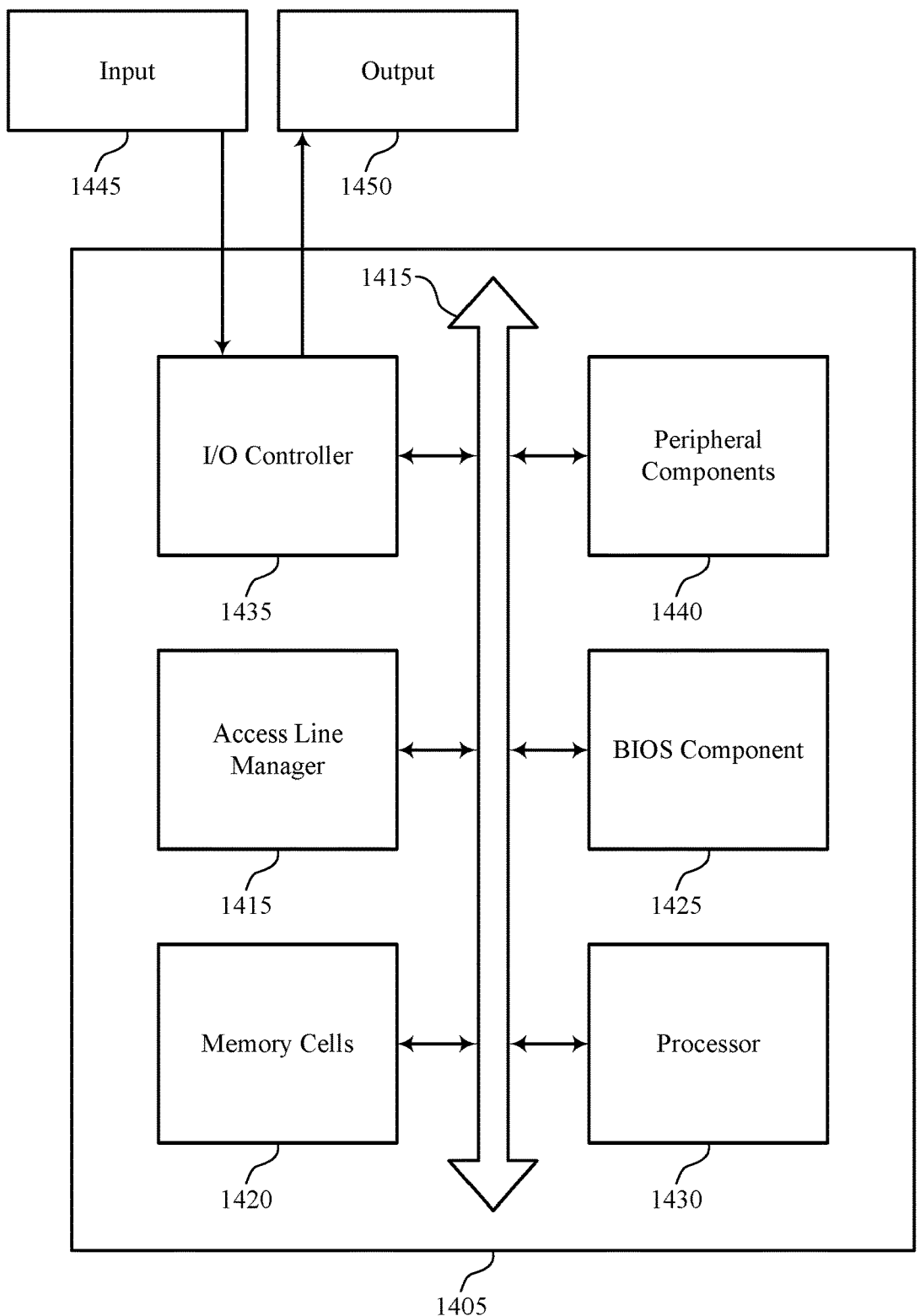
FIG. 14 illustrates a diagram of a system including a device that supports access line management for an array of memory cells in accordance with examples of the present disclosure.

FIG. 14 shows a diagram of a system 1400 including a device 1405 that supports access line management for an array of memory cells in accordance with examples of the present disclosure. Device 1405 may be an example of or include the components of memory array 100 as described above, e.g., with reference to FIG. 1. Device 1405 may include components for bi-directional voice and data communications including components for transmitting and receiving communications, including access line manager 1415, memory cells 1420, basic input/output system (BIOS) component 1425, processor 1430, I/O controller 1435, and peripheral components 1440. Access line manager 1415 may be an example of the access line manager 1315 described with reference to FIG. 13. These components may be in electronic communication via one or more buses (e.g., bus 1410).

Memory cells 1420 may store information (i.e., in the form of a logical state) as described herein.

BIOS component 1425 be a software component that includes BIOS operated as firmware, which may initialize and run various hardware components. BIOS component 1425 may also manage data flow between a processor and various other components, e.g., peripheral components, input/output control component, etc. BIOS component 1425 may include a program or software stored in read only memory (ROM), flash memory, or any other non-volatile memory.

Processor 1430 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1430 may be configured to operate a memory array using a memory controller. In other cases, a memory controller may be integrated into processor 1430. Processor 1430 may be configured to execute computer-readable instructions stored in a memory to perform various functions (e.g., functions or tasks supporting access line management for an array of memory cells).

I/O controller 1435 may manage input and output signals for device 1405. I/O controller 1435 may also manage peripherals not integrated into device 1405. In some cases, I/O controller 1435 may represent a physical connection or port to an external peripheral. In some cases, I/O controller 1435 may utilize an operating system such as iOS®, ANDROID®, MS-DOS®, MS-WINDOWS®, OS/2®, UNIX®, LINUX®, or another known operating system. In other cases, I/O controller 1435 may represent or interact with a modem, a keyboard, a mouse, a touchscreen, or a similar device. In some cases, I/O controller 1435 may be implemented as part of a processor. In some cases, a user may interact with device 1405 via I/O controller 1435 or via hardware components controlled by I/O controller 1435.

Peripheral components 1440 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 1445 may represent a device or signal external to device 1405 that provides input to device 1405 or its components. This may include a user interface or an interface with or between other devices. In some cases, input 1445 may be managed by I/O controller 1435, and may interact with device 1405 via a peripheral component 1440.

Output 1450 may also represent a device or signal external to device 1405 configured to receive output from device 1405 or any of its components. Examples of output 1450 may include a display, audio speakers, a printing device, another processor or printed circuit board, etc. In some cases, output 1450 may be a peripheral element that interfaces with device 1405 via peripheral component(s) 1440. In some cases, output 1450 may be managed by I/O controller 1435.

The components of device 1405 may include circuitry designed to carry out their functions. This may include various circuit elements, for example, conductive lines, transistors, capacitors, inductors, resistors, amplifiers, or other active or inactive elements, configured to carry out the functions described herein. Device 1405 may be a computer, a server, a laptop computer, a notebook computer, a tablet computer, a mobile phone, a wearable electronic device, a personal electronic device, or the like. Or device 1405 may be a portion or aspect of such a device.

Figure 15:
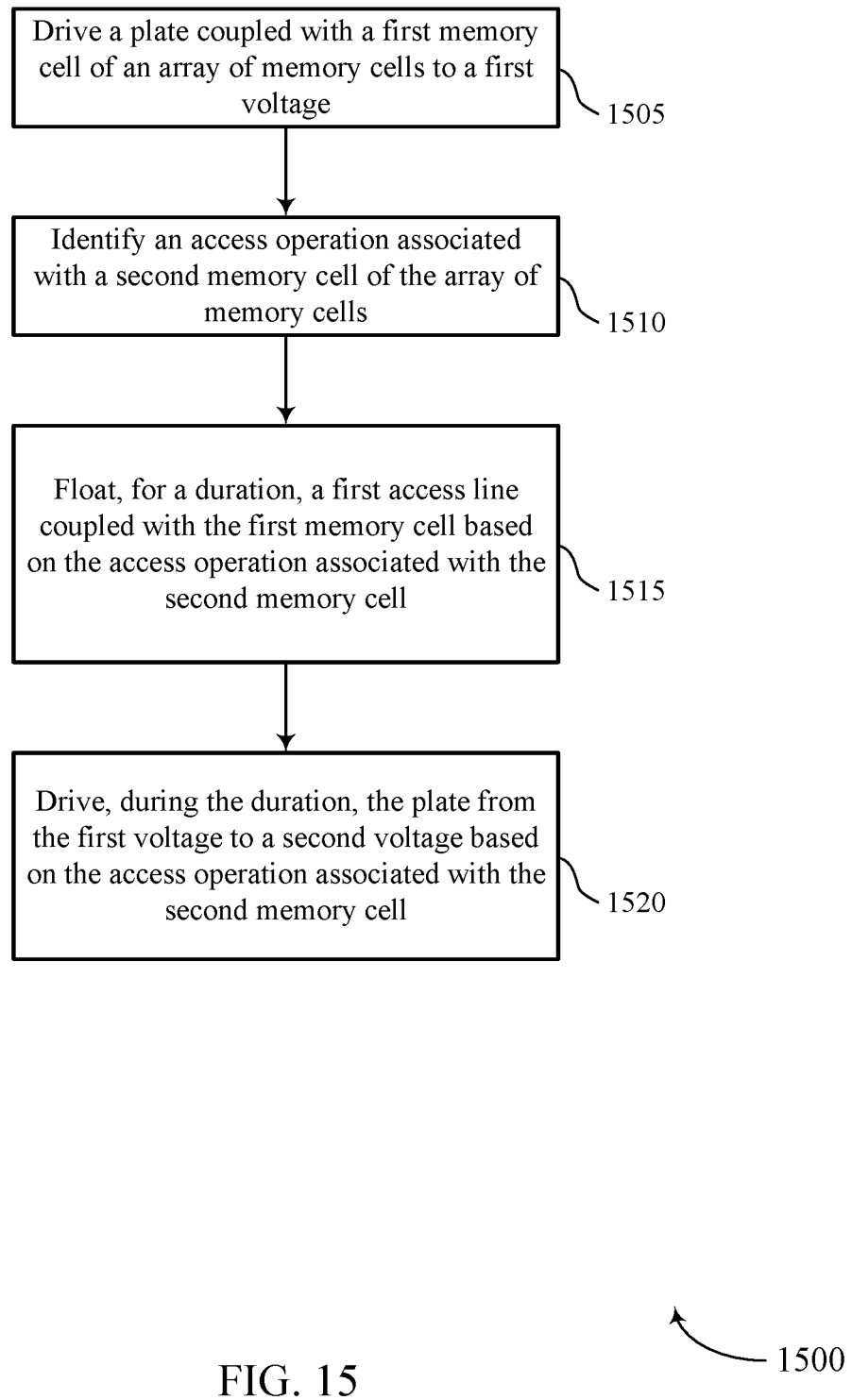
FIG. 15 illustrates a method for access line management for an array of memory cells in accordance with examples of the present disclosure.

FIG. 15 shows a flowchart illustrating a method 1500 for access line management for an array of memory cells in accordance with examples of the present disclosure. The operations of method 1500 may be implemented by a memory controller or its components as described herein. For example, the operations of method 1500 may be performed by an access line manager as described with reference to FIG. 6.

At 1505 a plate coupled with at least a first memory cell of an array of memory cells may be driven to a first voltage. The operations of 1505 may be performed according to the methods described herein. In certain examples, aspects of the operations of 1505 may be performed by a driving component as described with reference to FIG. 6.

At 1510 access operation associated with a second memory cell of the array of memory cells may be identified. The operations of 1510 may be performed according to the methods described herein. In certain examples, aspects of the operations of 1510 may be performed by an identification component as described with reference to FIG. 6.

At 1515 a first access line coupled with the first memory cell of the array of memory cells may be floated, for a duration, based at least in part on the access operation associated with the second memory cell. In some examples, the floating may be based on applying a first control signal having a first voltage swing and a second control signal having a second voltage swing different than the first voltage swing to a driver for the first access line. The operations of 1515 may be performed according to the methods described herein. In certain examples, aspects of the operations of 1515 may be performed by a floating component as described with reference to FIG. 6.

At 1520 the plate may be driven, during the duration, from the first voltage to a second voltage based at least in part on the access operation associated with the second memory cell. The operations of 1520 may be performed according to the methods described herein. In certain examples, aspects of the operations of 1520 may be performed by a driving component as described with reference to FIG. 6.

In some examples, the method can include floating, for at least a portion of the duration, a first node of the word line driver. The first node of the word line driver may be configured to receive a third control signal, and floating the first access line may be based on floating the first node. In some examples, the first control signal may be applied to a gate of a transistor included in the driver and the first node can include a source or drain of the transistor. In some examples, the transistor may be in a cascode configuration with a second transistor included in the driver.

In some examples, a fourth control signal may be applied to a third transistor included in the driver. The fourth control signal may be inverted relative to and has a different voltage swing than the third control signal.

In some examples, the method may include floating, for at least a portion of the duration, a second node of the driver. The second node may include a source or a drain of the fourth transistor included in the driver. In some examples, floating the first access line may be based on floating the second node. In some examples, the second control signal may be applied to a gate of the fourth transistor.

An apparatus is described. In some examples, the apparatus may include a memory cell coupled with an access line, a driver coupled with the access line, and a control circuit coupled with the driver and operable to generate a first control signal for the driver and a second control signal for the driver. In some examples, the second control signal may have a different voltage swing than the first control signal.

The apparatus may include a second control circuit coupled with the driver and may be operable to float a first node of the driver. In some examples, the driver may be operable to float the access line based on the first node being floated. The apparatus may include a third control circuit coupled with the driver and operable to float a second node of the driver. In some examples, the driver may be operable to float the access line based on the second node being floated.

In some examples, the driver is one of a subset of a set of drivers and each driver of the set may be coupled with a respective access line for a memory array that includes the memory cell. In some examples the control circuit may be coupled with each driver of the subset and the first control signal and the second control signal may be common to the drivers of the subset. In some examples, the apparatus may include a third control circuit coupled with the second subset of the set of drivers. The third control circuit may be operable to generate a third control signal that is common to the drivers of the second subset.

In some examples, the third control circuit may be further operable to generate a fourth control signal that is common to the drivers of the second subset. The fourth control signal may be inverted relative to and have a different voltage swing than the third control signal.

The apparatus may include a controller coupled with the control circuit, the second control circuit, and the third control circuit. The controller may be operable to identify an access operation associated with a second memory cell of the memory array and cause the second control circuit to float a first node of the driver during a portion of the access operation associated with the second memory cell based on the second subset not including the driver. In some examples, the second memory cell may be coupled with a second access line that is coupled with a second driver of the set. The second subset may not include the second driver. In some examples, the driver may be operable to float the access line based at least in part on the first node being floated.

The controller may be operable to identify a second access operation associated with a third memory cell of the memory array and cause the second control circuit to drive the node of the deriver to a first voltage during the access operation associated with the third memory cell based on the second driver being coupled with the second control circuit. The third memory cell may be coupled with a third access line that is coupled with a third driver of the set. In some examples, the third driver may be coupled with the second control circuit.

The apparatus may include a controller coupled with the control circuit, the second control circuit, and the third control circuit. The controller may be operable to identify an access operation associated with a second memory cell of the memory array and cause the third control circuit to float a second node of the driver during at least a portion of the access operation associated with the second memory cell based on the second driver being coupled with the control circuit. In some examples, the second driver may be coupled with the control circuit. The driver may be operable to float the access line based on the second node being floated.

In some examples, the controller may be further operable to identify a second access operation associated with a third memory cell of the memory array and cause the third control circuit to drive the second node of the driver to a first voltage or a second voltage during the access operation associated with the third memory cell based on the subset not including the third driver. In some examples, the subset may not include the third driver.

An apparatus is described. In some examples, the apparatus may include a memory cell coupled with an access line, a driver coupled with the access line, where the driver can include a first transistor in a cascode configuration with a second transistor, and a control circuit coupled with the driver and operable to output a first control signal to the first transistor and a second control signal to a third transistor of the driver.

In some examples, the apparatus may include a second memory cell. A source of the first transistor and a source of the third transistor may be operable to be floated concurrent with an access operation for the second memory cell. In some examples, the driver may be operable to float the access line based on one or more of the source of the first transistor or the source of the third transistor being floated.

An apparatus is described. In some examples, the apparatus may include means for driving a plate coupled with a first memory cell of an array of memory cells to a first voltage, means for identifying an access operation associated with a second memory cell of the array of memory cells, means for floating, for a duration, a first access line coupled with the first memory cell based at least in part on the access operation associated with the second memory cell, wherein the floating is based at least in part on applying a first control signal having a first voltage swing and a second control signal having a second voltage swing different than the first voltage swing to a driver for the first access line, and means for driving, during the duration, the plate from the first voltage to a second voltage based at least in part on the access operation associated with the second memory cell.

In some examples, the apparatus may include means for floating, for at least a portion of the duration, a first node of the word line driver, wherein the first node of the word line driver is configured to receive a third control signal, and wherein floating the first access line is based at least in part on floating the first node. In so examples, the apparatus may include means for applying a fourth control signal to a third transistor included in the driver, wherein the fourth control signal is inverted relative to and has a different voltage swing than the third control signal. In some examples, the apparatus may include means for floating, for at least a portion of the duration, a second node of the driver, wherein the second node comprises a source or a drain of a fourth transistor included in the driver, and wherein floating the first access line is based at least in part on floating the second node.

It should be noted that the methods described above describe possible implementations, and that the operations and the steps may be rearranged or otherwise modified and that other implementations are possible. Furthermore, examples from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially" means that the modified characteristic (e.g., a verb or adjective modified by the term substantially) need not be absolute but is close enough so as to achieve the advantages of the characteristic.

The term "isolated" refers to a relationship between components in which electrons are not presently capable of flowing between them; components are isolated from each other if there is an open circuit between them. For example, two components physically connected by a switch may be isolated from each other when the switch is open.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   floating, for a duration, a first access line coupled with a first memory cell of an array of memory cells based at least in part on an access operation for a second memory cell of the array of memory cells;
   driving, during at least a portion of the duration and based at least in part on the access operation for the second memory cell, a plate for the first memory cell from a first voltage to a second voltage; and
   driving the first access line to a third voltage after driving the plate from the first voltage to the second voltage.

2. The method of claim 1, further comprising:
   floating the first access line for a second duration after driving the first access line to the third voltage; and
   driving, during at least a portion of the second duration and based at least in part on the access operation for the second memory cell, the plate to the first voltage after driving the plate from the first voltage to the second voltage.

3. A method, comprising:
   floating, for a duration, a first access line coupled with a first memory cell of an array of memory cells based at least in part on an access operation for a second memory cell of the array of memory cells;
   driving, during at least a portion of the duration and based at least in part on the access operation for the second memory cell, a plate for the first memory cell from a first voltage to a second voltage;
   driving a second access line coupled with the second memory cell to a third voltage different than the first voltage and the second voltage; and
   driving a third access line coupled with a third memory cell to a fourth voltage while driving the plate from the first voltage to the second voltage.

4. The method of claim 1, further comprising:
   driving, during at least a second portion of the duration and based at least in part on the access operation for the second memory cell, the plate from the second voltage to the first voltage.

5. The method of claim 1, wherein the plate is shared by the first memory cell and the second memory cell.

6. A method, comprising:
   floating, for a duration, a first access line coupled with a first memory cell of an array of memory cells based at least in part on an access operation for a second memory cell of the array of memory cells, wherein floating the first access line comprises:
      applying a first control signal having a first voltage swing to a driver for the first access line; and
      applying a second control signal having a second voltage swing different than the first voltage swing to the driver for the first access line; and
   driving, during at least a portion of the duration and based at least in part on the access operation for the second memory cell, a plate for the first memory cell from a first voltage to a second voltage.

7. The method of claim 6, wherein the first control signal is applied to a gate of a first transistor included in the driver, and wherein the first transistor is in a cascode configuration with a second transistor.

8. The method of claim 6, further comprising:
   floating, for at least a first portion of the duration, a first node of the driver based at least in part on applying a third control signal to the first node; and
   floating, for at least a second portion of the duration, a second node of the driver based at least in part on applying the second control signal to the second node.

9. The method of claim 8, further comprising:
   applying a fourth control signal having a third voltage swing to a third transistor included in the driver.

10. An apparatus, comprising:
    a first memory cell;
    a second memory cell;
    a first access line coupled with the first memory cell;

a driver coupled with the first access line and configured to:
float the first access line during a first duration based at least in part on an access operation for the second memory cell; and
float the first access line for a second duration during which a plate is driven to a second voltage; and
a plate driver configured to drive, based at least in part on the access operation for the second memory cell, the plate from a first voltage to the second voltage during at least a portion of the second duration.

11. The apparatus of claim 10, wherein the driver is one of a subset of a set of drivers, each driver of the set of drivers coupled with a respective access line for a memory array that includes the first memory cell and the second memory cell.

12. An apparatus, comprising:
a first memory cell;
a second memory cell;
a first access line coupled with the first memory cell;
a driver coupled with the first access line and configured to float the first access line during a duration based at least in part on an access operation for the second memory cell;
a first control circuit coupled with the driver and operable to generate a first control signal having a first voltage swing for the driver and a second control signal having a second voltage swing for the driver; and
a plate driver configured to drive, based at least in part on the access operation for the second memory cell, a plate from a first voltage to a second voltage during at least a portion of the duration.

13. The apparatus of claim 12, wherein the driver is one of a subset of a set of drivers, further comprising:
a second control circuit coupled with a second subset of the set of drivers, wherein the driver is one of the second subset; and
a third control circuit coupled with the second subset of the set of drivers, wherein the third control circuit is configured to generate a third control signal having a third voltage swing and a fourth control signal having a fourth voltage swing, wherein the third control signal and the fourth control signal are common to the second subset of the set of drivers.

14. The apparatus of claim 13, wherein the third control signal is inverted relative to the fourth control signal.

15. An apparatus, comprising:
a first memory cell;
a second memory cell;
a first access line coupled with the first memory cell;
a driver coupled with the first access line and configured to float the first access line during a duration based at least in part on an access operation for the second memory cell; and
a plate driver configured to drive, based at least in part on the access operation for the second memory cell, a plate from a first voltage to a second voltage during at least a portion of the duration, wherein the driver is further configured to:
drive the first access line to a third voltage after the plate is driven from the first voltage to the second voltage; and
drive a second access line coupled with the second memory cell to a fourth voltage that is associated with a first logic value of the second memory cell while driving the first access line to the third voltage.

16. An apparatus, comprising:
a first memory cell;
a second memory cell;
a first access line coupled with the first memory cell;
a driver coupled with the first access line; and
a controller configured to cause the apparatus to:
initiate floating the first access line based at least in part on an access operation for the second memory cell;
initiate driving a plate from a first voltage to a second voltage based at least in part on the access operation for the second memory cell; and
initiate driving the first access line to a third voltage after driving the plate from the first voltage to the second voltage.

17. An apparatus, comprising:
a first memory cell;
a second memory cell;
a first access line coupled with the first memory cell;
a driver coupled with the first access line; and
a controller configured to cause the apparatus to:
initiate floating the first access line based at least in part on an access operation for the second memory cell wherein, to initiate floating the first access line, the controller is configured to cause the apparatus to:
apply a first control signal having a first voltage swing to the driver coupled with the first access line; and
apply a second control signal having a second voltage swing different than the first voltage swing to the driver coupled with the first access line; and
initiate driving a plate from a first voltage to a second voltage based at least in part on the access operation for the second memory cell.

18. The apparatus of claim 17, wherein the controller is further configured to cause the apparatus to:
initiate floating a first node of the driver based at least in part on applying a third control signal to the first node; and
initiate floating a second node of the driver based at least in part on applying the second control signal to the second node.

* * * * *